United States Patent [19]

Hasegawa

[11] Patent Number: 5,325,073

[45] Date of Patent: Jun. 28, 1994

[54] AMPLIFYING APPARATUS WITH AC/DC FEEDBACK CIRCUIT

[75] Inventor: Kazuo Hasegawa, Furukawa, Japan

[73] Assignee: Alps Electric Co., Ltd., Tokyo, Japan

[21] Appl. No.: 41,633

[22] Filed: Apr. 1, 1993

[30] Foreign Application Priority Data

Apr. 9, 1992 [JP] Japan .................................. 4-088822
Apr. 13, 1992 [JP] Japan .................................. 4-092970
Apr. 24, 1992 [JP] Japan .................................. 4-106852

[51] Int. Cl.$^5$ .............................................. H03F 1/30
[52] U.S. Cl. ...................................... 330/290; 330/85
[58] Field of Search ............... 330/290, 294, 296, 308, 330/85, 96, 97

[56] References Cited

U.S. PATENT DOCUMENTS 3,331,029 7/1967 Banasiewicz et al. ............... 330/290
4,785,257 11/1988 Yokoyama .
4,939,475 7/1990 Prasse et al. ...................... 330/308 X

*Primary Examiner*—Steven Mottola
*Attorney, Agent, or Firm*—Guy W. Shoup; Patrick T. Bever

[57] ABSTRACT

An amplifying apparatus provided by the present invention comprises a direct-coupled inverting amplifier and an alternating-current feedback circuit as well as a direct-current feedback circuit connected between input and output terminals of the direct-coupled inverting amplifier, wherein the direct-current feedback circuit comprises an operating-point extracting circuit for extracting a direct-current component and a bias-voltage generator having a direct-current signal gain larger than an alternating-current signal gain thereof and a direct-current operating bias voltage of the direct-coupled inverting amplifier is set by using a signal output by the bias-voltage generator. Such a configuration enables the amplifying apparatus to offer high-speed operations, a large dynamic range and a highly stable direct-current operating point regardless of the type of a signal input therein and allows an alternating-current signal gain to be set independently of the stability of the direct-current operating point.

16 Claims, 23 Drawing Sheets

AMPLIFYING APPARATUS WITH AC/DC FEEDBACK CIRCUIT

BACKGROUND OF THE INVENTION

1. Field of the Invention

The present invention relates to an amplifying apparatus suitable for amplification of, among other things, a detection signal output by an object detecting apparatus. In particular, the present invention relates to an amplifying apparatus which has a high direct-current operating-point stability and a large dynamic range as well as an alternating-current signal gain adjustable independently of the high direct-current operating-point stability.

2. Description of the Related Art

As shown in FIG. 24, a conventional amplifying apparatus used for amplification of a detection signal output by an object detecting apparatus comprises an alternating-current coupling inverting amplifier 100, a comparator 103, a direct-current power supply 104, a signal input terminal 105 and a signal output terminal 106. The alternating-current coupling inverting amplifier 100 further comprises amplifying transistors 100a, 100b and 100c which are each capacitor-coupled. The comparator 103 further comprises an operational amplifier 101 and a potentiometer 102.

As a signal from an object detecting sensor, not shown in the figure, is supplied to the signal input terminal 105. The signal is amplified by the alternating-current coupling inverting amplifier 100 employed by the conventional amplifying apparatus to a predetermined level before being supplied to the comparator 103. The operational amplifier 101 employed in the comparator 103 compares the amplified signal supplied thereto to a reference voltage generated by the potentiometer 102. The comparison produces an output signal higher than a predetermined level at the signal output terminal 106.

By the way, the amplifying apparatus of this type employs the amplifying transistors 100a, 100b and 100c which are each capacitor-coupled as described above. In the case of a pulse signal having a small duty cycle or a signal with a duty cycle varying with the lapse of time, the direct-current operating point of the alternating-current coupling inverting amplifier 100 for such a signal fluctuates so that the signal cannot be amplified accurately. In addition, the amplifying apparatus has a problem that a signal amplified by the alternating-current coupling inverting amplifier 100 with a fluctuating direct-current operating point causes the comparator 103 to produce a varying output-signal level due to the fluctuation of the direct-current operating point.

In order to solve the problem, a new technique is introduced. In this technique, the alternating-current coupling inverting amplifier 100 is replaced by an operational amplifier or an amplifying circuit which has a non-differential input and can thus be used for a high-frequency operation. However, the new technique introduces other problems. That is to say, the operational amplifier cannot be used for high-frequency operation or, if it can, it consumes much power, requiring a high direct-current operating voltage. As for the amplifying circuit proposed in the new technique, its dynamic range is small and its direct-current operating point is unstable.

It is an object of the present invention to provide an amplifying apparatus which can solve the technical problems described above.

SUMMARY OF THE INVENTION

A direct-coupled inverting amplifier provided by the present invention comprises a plurality of amplifying stages which are each DC-coupled. The number of amplifying stages is odd. Ideally, the number of amplifying stages is three even though an amplifying-stage count of unity also works as well. Since the direct-coupled inverting amplifier does not have an internal direct-current bias circuit or an internal differential circuit in particular, it can be used for a high-frequency operation and operate over a wide dynamic range as well. In addition, the direct-coupled inverting amplifier does not employ an internal loop feedback circuit, giving a high gain.

Furthermore, an alternating-current feedback circuit is incorporated separately in parallel to a direct-current feedback circuit. Accordingly, the total DC-signal gain of an amplifying apparatus employing the direct-coupled inverting amplifier can be set without regard to the stability of the operating point of the direct-coupled inverting amplifier which depends on the direct-current feedback circuit.

Moreover, the direct-current feedback circuit comprises an operating-point extracting circuit for extracting only a direct-current component from a signal output by the inverting amplifier and a bias-voltage generator which includes a differential amplifier for comparing the direct component to a reference voltage and supplying the comparison output to the inverting amplifier as a direct-current bias voltage. Since the differential amplifier is designed to give a direct-current signal gain larger than its alternating-current signal gain, it is possible to stabilize the direct-current operating point of the inverting amplifier at any arbitrary point. On top of that, only a direct-current signal is supplied to the differential amplifier, allowing the differential amplifier to operate at a low frequency.

BRIEF DESCRIPTION OF THE DRAWINGS

FIGS. 19(a), 19(b), 9(c) and 19(d) are signal-waveform diagrams showing waveforms of other signals processed by the seventh embodiment;

DETAILED DESCRIPTION OF THE PREFERRED EMBODIMENTS

Figure 13:
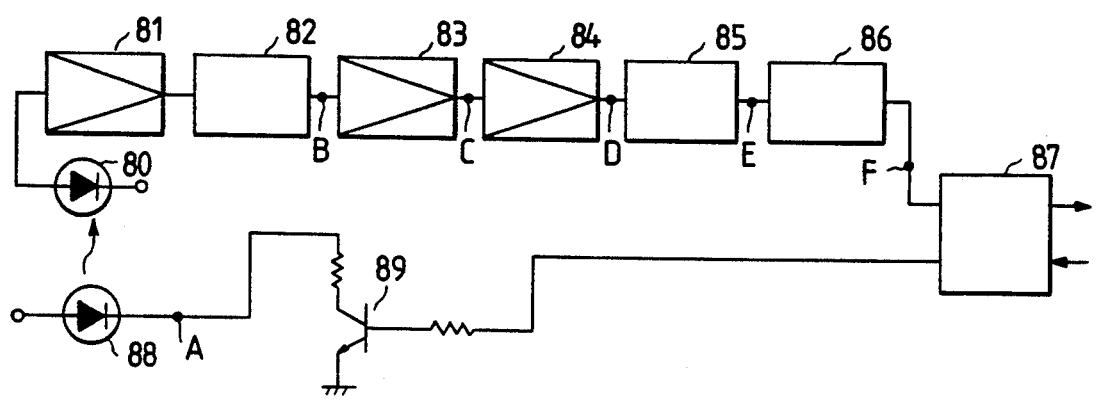
FIG. 13 is a block diagram of a typical object detecting apparatus to which the first to fifth embodiments provided by the present invention can be applied.
Figure 14:
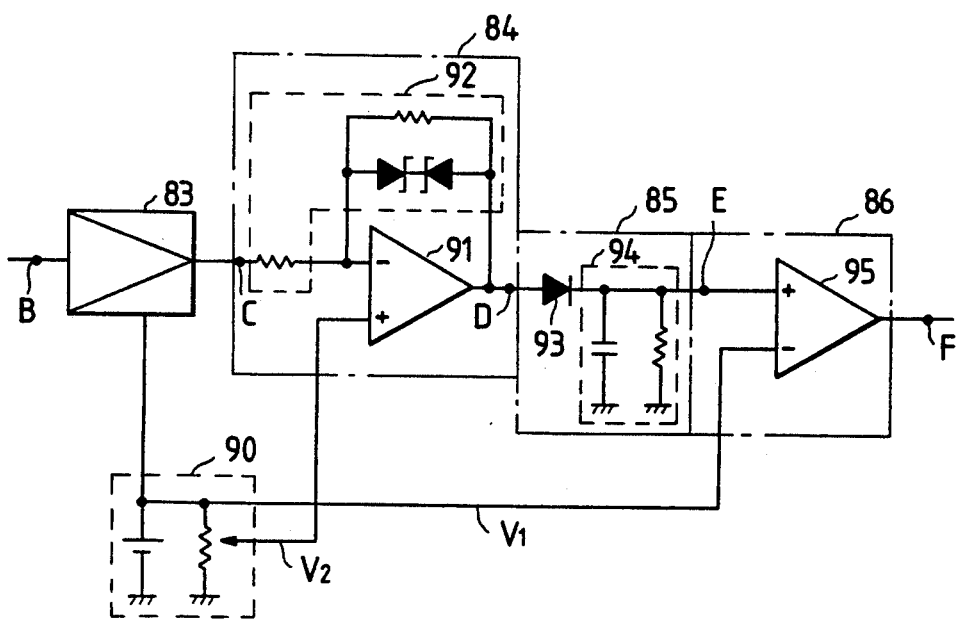
FIG. 14 is a circuit configuration diagram showing a detailed circuit of part of the object detecting apparatus shown in FIG. 13.
Figure 15:
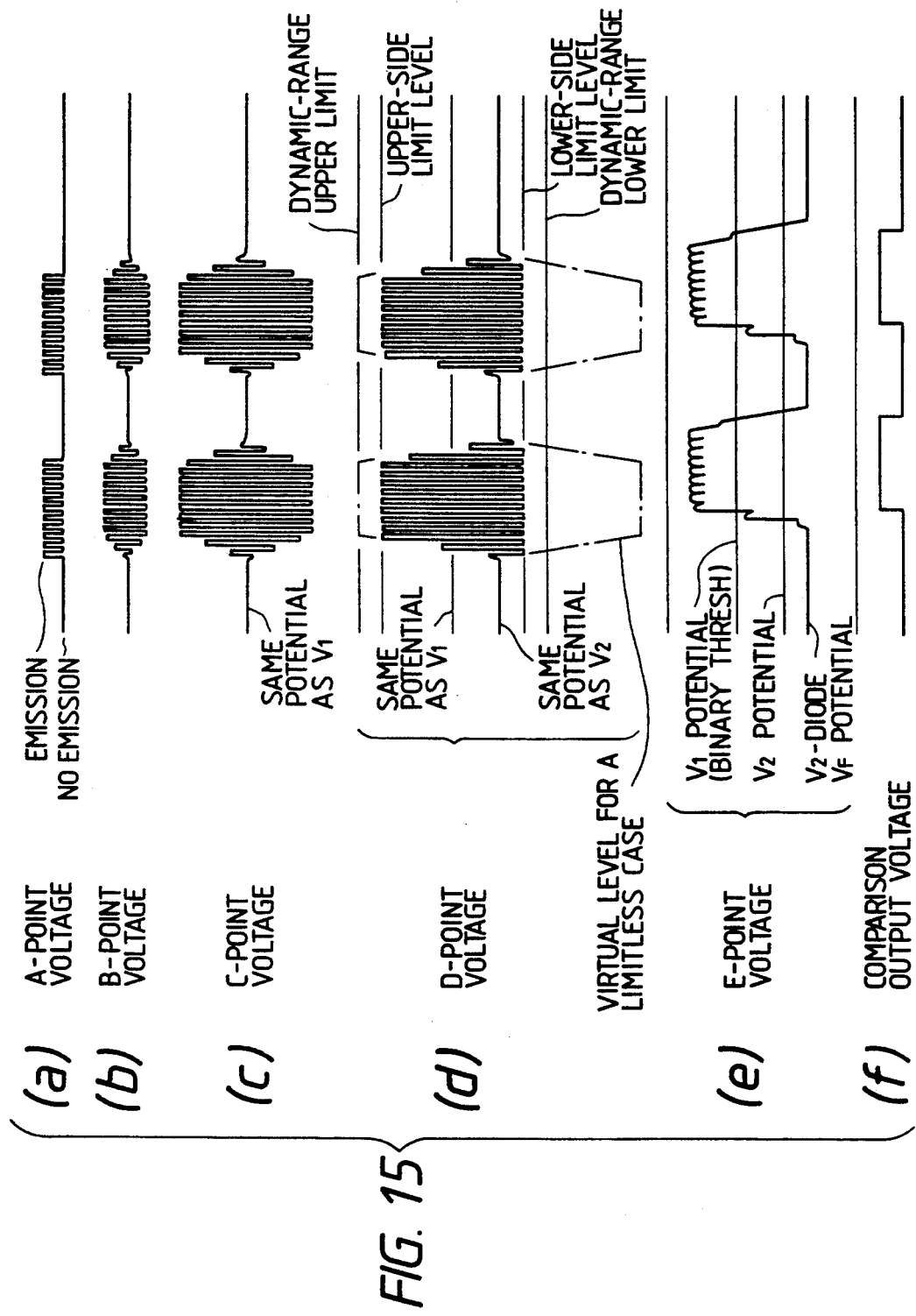
FIGS. 15(a), 15(b), 15(c), 15(d), 15(e) and 15(f) are signal-waveform diagrams showing signal states of various portions of the object detecting apparatus shown in FIG. 13.

The present invention will become more apparent from the following detailed description of an object detecting apparatus, to which the amplifying apparatus provided by the present invention is applicable, with reference to FIGS. 13 to 15.

As shown in FIG. 13, the object detecting apparatus comprises an optical sensor 80 made up of a photodiode, a preamplifier 81, a narrow-band low-pass filter 82, an amplifying apparatus 83 provided by the present invention, a limiter amplifier 84 serving as a comparator, a wave detector 85, a binary circuit 86, a microcomputer 87, an LED 88 and a driving transistor 89.

Receiving a driving signal output by the microcomputer 87 through the driving transistor 89, the LED 88 emits light. A signal for detecting an object output by the optical sensor 80 based on the presence/absence of the light emitted by the LED 88 is supplied to the microcomputer 87 through the preamplifier 81, the narrow-band low-pass filter 82, the amplifying apparatus 83 provided by the present invention, the limiter amplifier 84 serving as a comparator, the wave detector 85 and the binary circuit 86.

Next, the limiter amplifier 84, the wave detector 85 and the binary circuit 86 are described in detail.

As shown in FIG. 14, the limiter amplifier 84 comprises a differential amplifier 91 and a negative-feedback circuit 92 which further comprises two resistors and a pair of Zener diodes wired back to back. Also as shown in the figure, the wave detector 85 comprises a detection diode 93 and a smoothing circuit 94 which further comprises a resistor and a capacitor. As for the binary circuit 86, the constituting element is a differential circuit 95. A reference-voltage generator 90 comprising a power supply and a potentiometer produces two voltages V1 and V2 with V1 greater than V2 (V1>V2). The two voltages V1 and V2 are supplied to the binary circuit 86 and a limiter amplifier 84 respectively.

The principle of operation of the object detecting apparatus is explained by referring to a signal-waveform diagram of a variety of portions thereof shown in FIGS. 15(a) to (f). FIG. 15(a) is a diagram showing the waveform of a signal output by the LED 88 or point A shown in FIG. 13. FIG. 15(b) is a diagram showing the waveform of a signal input to the amplifying apparatus 83 or point B shown in FIGS. 13 and 14. FIG. 15(c) is a diagram showing the waveform of a signal output by the amplifying apparatus 83 or point C shown in FIGS. 13 and 14. FIG. 15(d) is a diagram showing the waveform of a signal output by the limiter amplifier 84 or point D shown in FIGS. 13 and 14. FIG. 15(e) is a diagram showing the waveform of a signal output by the wave detector 85 or point E shown in FIGS. 13 and 14. FIG. 15(f) is a diagram showing the waveform of a signal output by the binary circuit 86 or point F shown in FIGS. 13 and 14.

The description of the principle of operation of the object detecting apparatus begins with the microcomputer 87 for, among other functions, generating an intermittent signal with a predetermined frequency of repetition and a predetermined period of continuation. Driven by the driving signal through the driving transistor 89, the LED 88 emits an optical signal shown in FIG. 15(a) toward a detection object. Part of the optical signal is reflected by the detection object and then received by the optical sensor 80. The optical sensor 80 converts the optical signal into a detection signal which represents the magnitude of the optical signal. The detection signal is then amplified by the preamplifier 81 to a predetermined level before being supplied to the narrow-band low-pass filter 82 for eliminating undesired components such as noise. The narrow-band low-pass filter 82 converts the detection signal into a burst signal having a sinusoidal waveform shown in FIG. 15(b). The burst signal is then supplied to the amplifying apparatus 83 wherein it is converted into an amplified signal shown in FIG. 15(c) having the voltage V1 as a reference voltage. The amplified signal is then supplied to the limiter amplifier 84. The amplified signal is further amplified to a limit signal shown in FIG. 15(d) which is trimmed at positive and negative levels, with the negative-side cut larger than the positive-side cut, by the voltage V2 supplied to the differential amplifier 91 employed in the limiter amplifier 84. The limit signal is then supplied to the binary circuit 85. Subsequently, the limit signal is sliced by the voltage V1 supplied to the differential amplifier 95 employed in the binary circuit 85 and only the top portion on the positive-amplitude side of the limit signal is extracted to give a binary signal shown in FIG. 15(e) which is supplied to the microcomputer 87. Receiving the binary signal, the microprocessor 87 analyzes the waveform thereof to finally determine whether or not a detection object exists.

Next, an embodiment implementing the amplifying apparatus 83 in accordance with present invention is explained by referring to diagrams.

Figure 1:
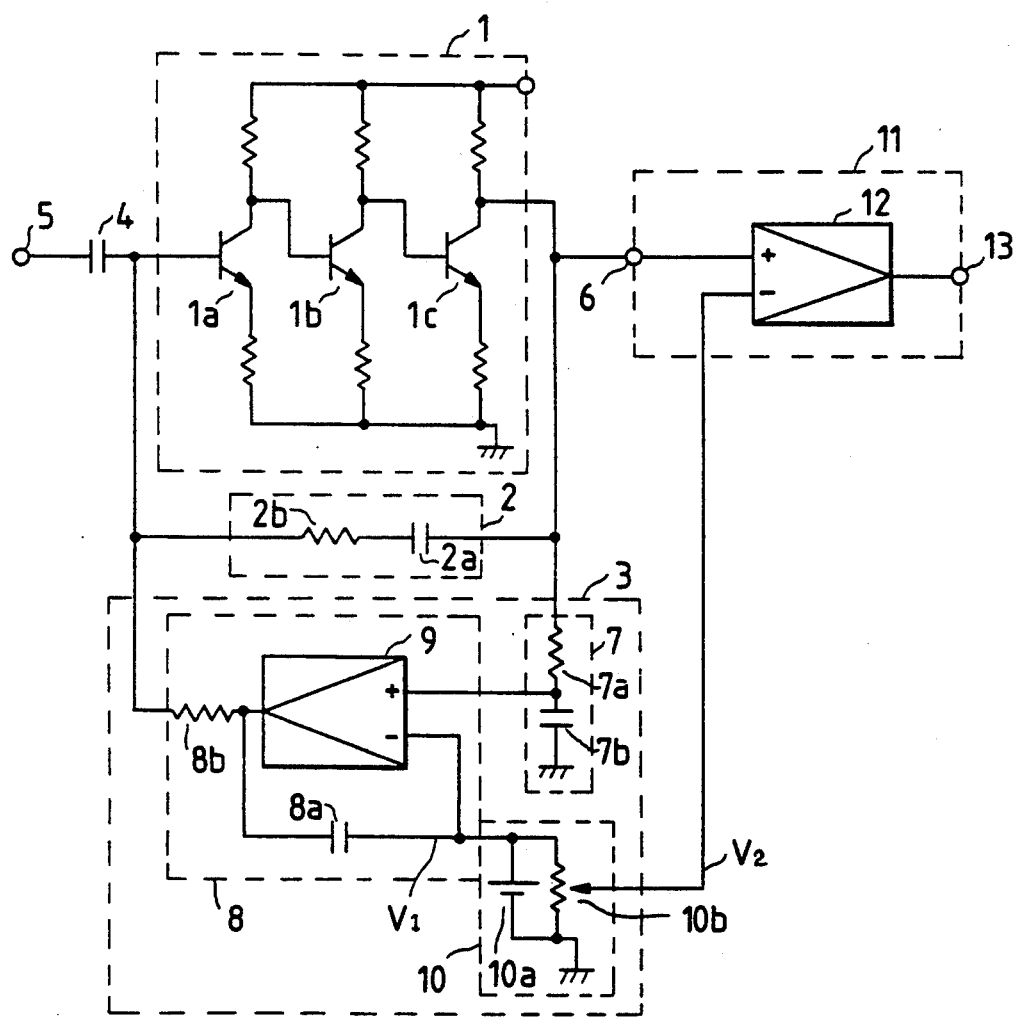
FIG. 1 is a circuit configuration diagram of a first embodiment implementing an amplifying apparatus in accordance with the present invention.

The explanation begins by referring to FIG. 1 which shows a circuit configuration of a first embodiment implementing an amplifying apparatus in accordance with the present invention and FIG. 2, a diagram showing waveforms of signals appearing at signal input and signal output terminals of the first embodiment.

As shown in FIG. 1, the amplifying apparatus implemented by this embodiment comprises a direct-coupled inverting amplifier 1, an alternating-current feedback circuit 2, a direct-current feedback circuit 3, an input coupling capacitor 4, a signal input terminal 5, a signal output terminal 6, a low-pass filter 7 serving as an operating-point extracting circuit, a bias-voltage generator 8, a differential amplifier 9, a reference-voltage supply 10, a comparator 11, another differential amplifier 12 and an output terminal 13. The direct-coupled inverting amplifier 1 further comprises amplifying transistors 1a, 1b and 1c.

The transistors 1a, 1b and 1c constituting the direct-coupled inverting amplifier 1 are directly coupled as amplifying stages in a configuration without direct-current bias supplying circuits between the amplifying stages. The alternating-current feedback circuit 2 and the direct-current feedback circuit 3 are connected in parallel to an input terminal which is tied to the signal input terminal 5 through the input coupling capacitor 4. The output terminal 13 is connected to the signal output terminal 6 through the differential amplifier 12. The alternating-current feedback circuit 2 further comprises a feedback capacitor 2a and a feedback resistor 2b which are connected to each other in series. The direct-current feedback circuit 3 comprises the low-pass filter 7 serving as an operating-point extracting circuit, the bias-voltage generator 8 and the reference-voltage supply 10. The low-pass filter 7 further comprises a series resistor 7a and a shunt capacitor 7b. The reference-voltage supply 10 further comprises a direct-current power supply 10a and a potentiometer 10b which are connected to each other in parallel. The bias-voltage generator 8 further comprises the differential amplifier 9, a feedback capacitor 8a and a feedback resistor 8b. The feedback capacitor 8a is connected between the inverting input and the output of the differential amplifier 9 whereas the feedback resistor 8b is connected in series to the output of the differential amplifier.

The operation of this embodiment is described by first assuming that no signal is supplied to the signal input terminal 5. With no signal input, a direct-current bias voltage from the bias-voltage generator 8 is supplied to the inverting amplifier 1. To describe it in more concrete terms, a voltage V1 obtained from the reference-voltage supply 10 is supplied to the inverting amplifier 1 through the differential amplifier 9 of the bias-voltage generator 8. The operating points with no signal input of the transistors 1a, 1b and 1c at the amplifying stages of the direct-coupled inverting amplifier 1 are set at a reference level which matches the value of the voltage V1.

Next, assume that an input burst signal shown in FIG. 15(b) is fed to the signal input terminal 5. In this case, a direct-current component of the input signal is cut by the input coupling capacitor 4 and, thus, only alternating-current components thereof are supplied to the inverting amplifier 1. The alternating-current components are amplified thereby at a high gain to produce an output signal shown in FIG. 15(c) having a reference voltage equal in magnitude to the voltage V1 cited earlier at the signal output terminal 6. This output signal is supplied to one of the terminals of the differential amplifier 12 of the comparator 11. A voltage V2 obtained from the reference-voltage supply 10 is fed to the other input of the differential amplifier 12. It should be noted that the voltage V2 is smaller than the voltage V1 (V1>V2). The differential amplifier 12 compares the amplitude of the output signal to the voltage V2. The result of the comparison is a limit signal shown in FIG. 15(d) appearing at the output terminal 13 of the comparator 11. The limit signal is trimmed by the voltage V2 at positive and negative levels, with the negative-side cut larger than the positive-side cut.

By the way, part of the output signal appearing at the signal output terminal 6 is supplied to the input terminal of the inverting amplifier 1 as a negative feedback through the alternating-current feedback circuit 2. The negative feedback makes the signal alternating-current gain and the signal-gain frequency characteristic dependent upon the impedance value of the alternating-current feedback circuit 2. By selecting the resistance value and the capacitance value of the feedback resistor 2b and the feedback capacitor 2a employed in the feedback circuit 2 respectively, the signal alternating-current gain and the signal-gain frequency characteristic can thus be set individually.

In addition, part of the output signal is also supplied to the direct-current feedback circuit 3. The output signal supplied to the direct-current feedback circuit 3 is first fed to the low-pass filter 7 which passes only the direct-current and low-frequency components thereof. The direct-current and low-frequency components are referred to hereafter simply as the direct-current component. The direct-current component is supplied to a non-inverting input of the differential amplifier 9 which also receives the voltage V1 produced by the reference-voltage supply 10 at its inverting input. The differential amplifier 9 compares the level of the direct-current component to that of the voltage V1, generating a comparison output voltage at its output terminal. The comparison output voltage is then supplied to the input terminal of the inverting amplifier 1 through the feedback resistor 8b. The magnitude and polarity of the comparison output voltage compensate variations of the reference level of the output signal described above which matches the voltage V1.

The reference level of the output signal may vary due to deviations of the direct-current operating points of the amplifying stages of the inverting amplifier 1 from their set points because of some reasons. However, a variation in reference level is fed back by the direct-current feedback circuit 3 to the inverting amplifier 1 as a comparison output voltage. Accordingly, the direct-current operating points are restored to their set points. As a result, a variation in reference level of the output signal is corrected immediately. In this way, the direct-current operating points of the inverting amplifier 1 can always be sustained at fixed points so as to considerably enhance the stability of the direct-current operating points.

By the way, the stability of the direct-current operating points of the inverting amplifier 1 depends on the magnitude of the gain of the direct-current feedback circuit 3 as is generally known. In other words, the stability of the direct-current operating points is dependent upon the magnitude of the direct-current gain of the differential amplifier 9 employed in the direct-current feedback circuit 3. Taking the dependence of the stability of the direct-current operating points upon the magnitude of the direct-current gain of the differential amplifier 9 into account, the coupling capacitor 8a is connected between the inverting input and the output terminal of the differential amplifier 9 to give a direct-current gain larger than its alternating-current gain. It should be noted that a typical value of the direct-current gain is 100 to 120 dB while that of the alternating-current gain is about 80 dB. Accordingly, by incorporating the differential amplifier 9 with such a configuration in the direct-current feedback amplifier 3, the direct-current operating points of the inverting amplifier 1 can be stabilized sufficiently. The stability of the direct-current operating points, in turn, allows the signal alternating-current gain and the signal-gain frequency characteristic to be set individually. In addition, the differential amplifier 9 mainly processes only the direct-current component. Accordingly, a low-frequency differential amplifier can adequately serve as the differential amplifier 9.

Figure 2A:
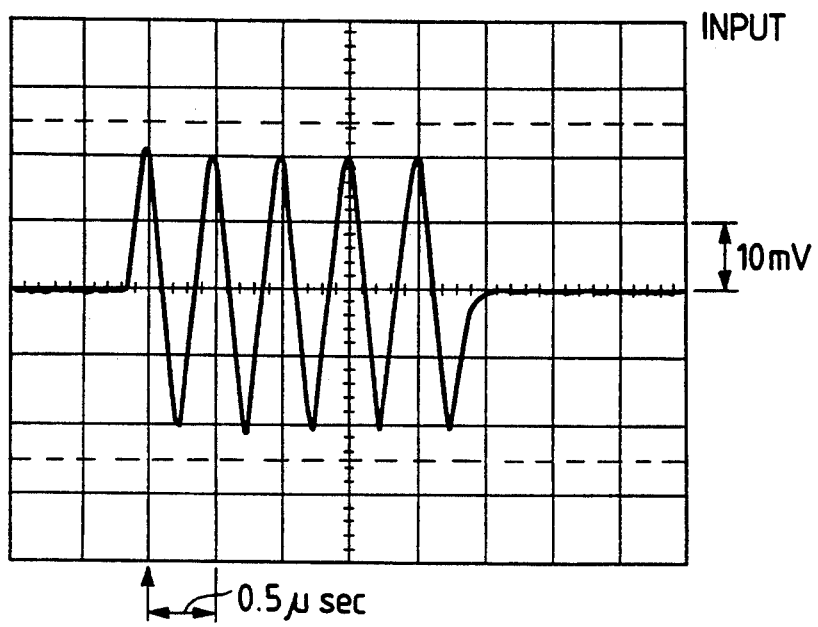
FIGS. 2(a) and 2(b) are waveform diagrams of signals appearing at signal input and signal output terminals of the first embodiment.
Figure 2B:
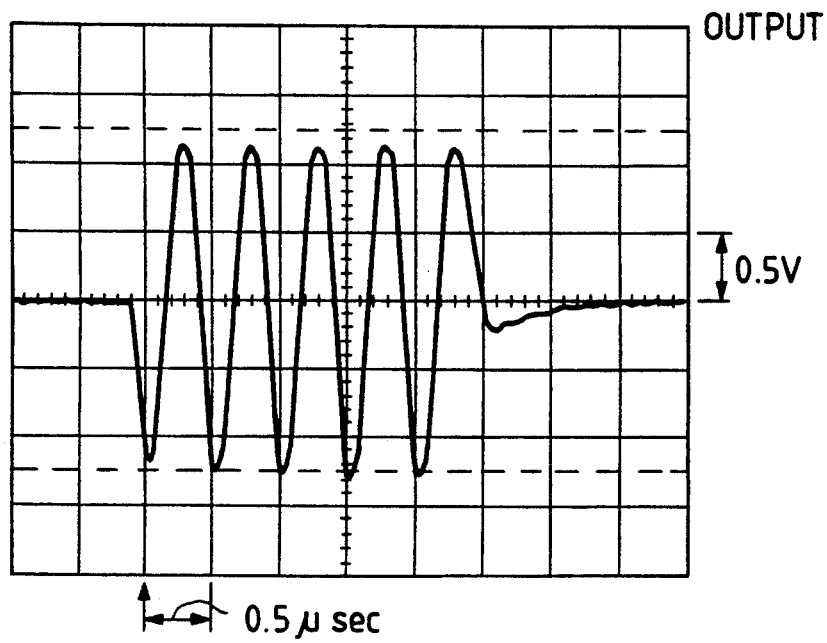

FIG. 2 is waveform diagrams of signals appearing at signal input and signal output terminals of the first embodiment. FIG. 2(a) shows the waveform of an input signal supplied to the signal input terminal 5 whereas FIG. 2(b) is a diagram showing the waveform of an output signal appearing at the signal output terminal 6. It is obvious from the waveforms that the output signal varies following closely the input signal and that the reference level of the output signal does not change.

Effects of the embodiment are listed as follows.

First of all, the direct-current operating points of the inverting amplifier 1 are always sustained at constant values by the direct-current negative feedback effect of the direct-current feedback circuit 3. The stability of the direct-current operating points can thus be enhanced substantially. In addition, since the direct-current operating points are very stable, the reference level of the output signal can also be held at a fixed value as well.

Secondly, the inverting amplifier 1 has neither internal direct-current bias supply circuit nor differential circuit. It is therefore possible to operate the inverting amplifier 1 at high frequencies and over a wide dynamic range. In addition, the inverting amplifier 1 also does not have an internal loop feedback circuit. Accordingly, it is also possible to obtain a high signal alternating-current gain as well.

In the third place, the alternating-current feedback circuit 2 and the direct-current feedback circuit 3 are connected in parallel between the input and the output of the amplifying circuit 1. Accordingly, the setting of the signal alternating-current gain and the signal-gain frequency characteristic of the inverting amplifier 1 as well as the setting for the stability of the direct-current operating points can be performed individually.

In the fourth place, the differential amplifier 9 of the direct-current feedback circuit 3 mainly processes only the direct-current component. Accordingly, a low-frequency differential amplifier can adequately serve as the differential amplifier 9.

Figure 3:
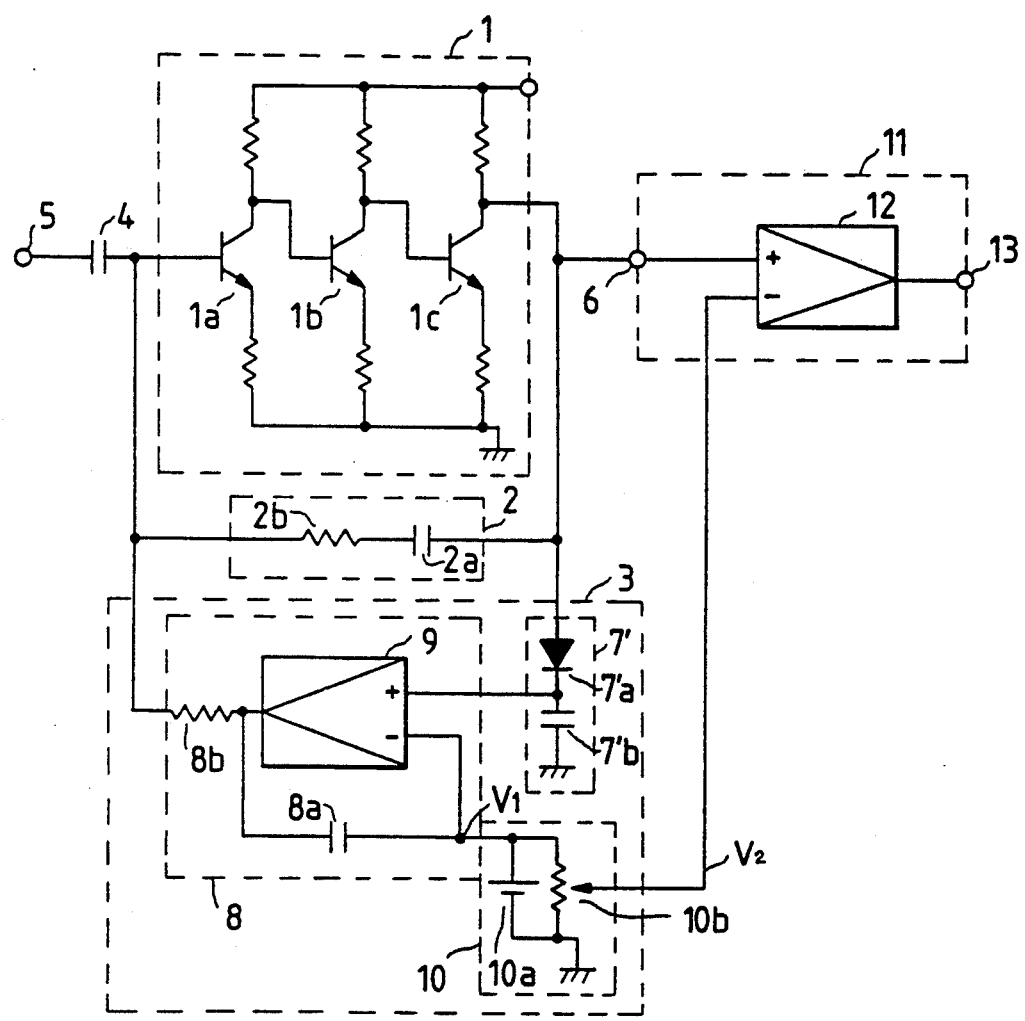
FIG. 3 is a circuit configuration diagram of a second embodiment implementing an amplifying apparatus in accordance with the present invention.
Figure 4:
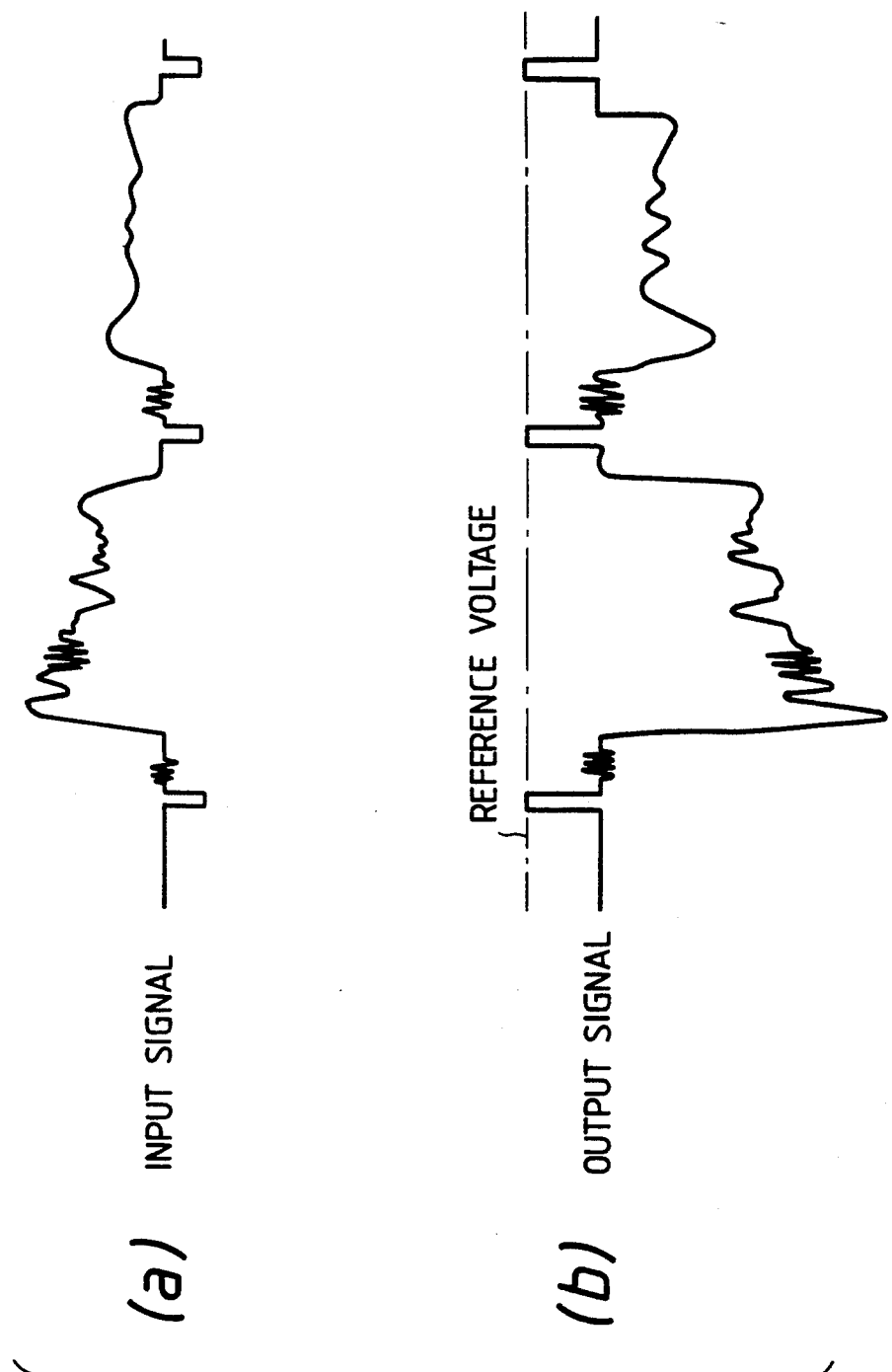
FIGS. 4(a) and 4(b) are signal-waveform diagrams showing video signal waveforms amplified by the second embodiment.

Next, a second embodiment provided by the present invention is described by referring to FIGS. 3 and 4.

As shown in FIG. 3, the second embodiment is different from the first embodiment only in that the operating-point extracting circuit is designed as a peak holder 7' comprising a series diode 7'a and a shunt capacitor 7'b. The rest of the configuration is the same as the first embodiment. Components identical with those employed in the first embodiment are assigned the same reference numerals and their description is omitted.

An operation in which a video signal is supplied to the signal input terminal 5 is described by referring to FIG. 4, a signal-waveform diagram showing video signal waveforms amplified by the second embodiment. Such an operation is referred hereafter to as a first operation example of the second embodiment. FIG. 4(a) and (b) show waveforms of an input video signal at the signal input terminal 5 and an output video signal at the signal output terminal 6 respectively.

First of all, assume that no signal is supplied to the signal input terminal 5. With no signal input, the direct-current operating points of the transistors 1a to 1c are set at the value of the direct-current bias voltage V1 as in the case of the first embodiment. However, the direct-current bias voltage V1 itself is set at a value different from the set value of the first embodiment or the reference level of the output signal. To be more specific, in the first operation example of the second embodiment, the direct-current bias voltage V1 is set at a level equal to a peak value (or a bottom value) of the amplitude of the output video signal.

Next, an input video signal shown in FIG. 4(a) is supplied to the signal input terminal 5. In this case, a direct-current component of the input signal is cut by the input coupling capacitor 4 and, thus, only alternating-current components thereof are supplied to the inverting amplifier 1. The alternating-current components are inverted and amplified thereby to produce an output video signal shown in FIG. 4(b) at the signal output terminal 6. This output video signal is supplied to one of the input terminals of the differential amplifier 12 of the comparator 11. A voltage V2 obtained from the reference-voltage supply 10 is fed to the other input terminal of the differential amplifier 12. The differential amplifier 12 compares the amplitude of the output video signal to the voltage V2. The result of the comparison is a limit signal appearing at the output terminal 13 of the comparator 11.

Also in the case of the first operation example, part of the output video signal is supplied to the direct-current feedback circuit 3. The output video signal supplied to the direct-current feedback circuit 3 is first fed to the peak holder 7' for extracting a peak amplitude value (or a bottom amplitude value) of the output video signal. The peak and bottom amplitude values are referred to hereafter simply as a peak value. The peak value is supplied to a non-inverting input terminal of the differential amplifier 9 which also receives the voltage V1 produced by the reference-voltage supply 10 at its inverting input terminal. The differential amplifier 9 compares the peak value to the level of the voltage V1, generating a comparison output voltage at its output. The comparison output voltage is then supplied to the input terminal of the inverting amplifier 1 through the feedback resistor 8b. The comparison output voltage fed back to the inverting amplifier 1 is used for adjusting the direct-current operating points of various amplification stages in the inverting amplifier 1. Also in this case, the comparison output voltage has an effect of compensating variations in voltage V1. As a result, the inverting amplifier 1 produces an output video signal which has a synchronization signal with its top level matching the voltage V1 as shown in FIG. 4(b). In addition, the level of the voltage V1 is not effected by variations in amplitude of the input video signal to be amplified.

In the first operation example of the embodiment for amplifying an input video signal as described above, the direct-current negative feedback effect of the direct-current feedback circuit 3 sustains the direct-current operating points of the inverting amplifier 1 at the value of the voltage V1, a highly stabilized value, even if the amplitude of the output video signal considerably varies with the lapse of time. In addition, the output video signal has a synchronization signal with its top level sustained at the voltage V1. Accordingly, its pedestal level is also held at an almost fixed value.

Figure 5:
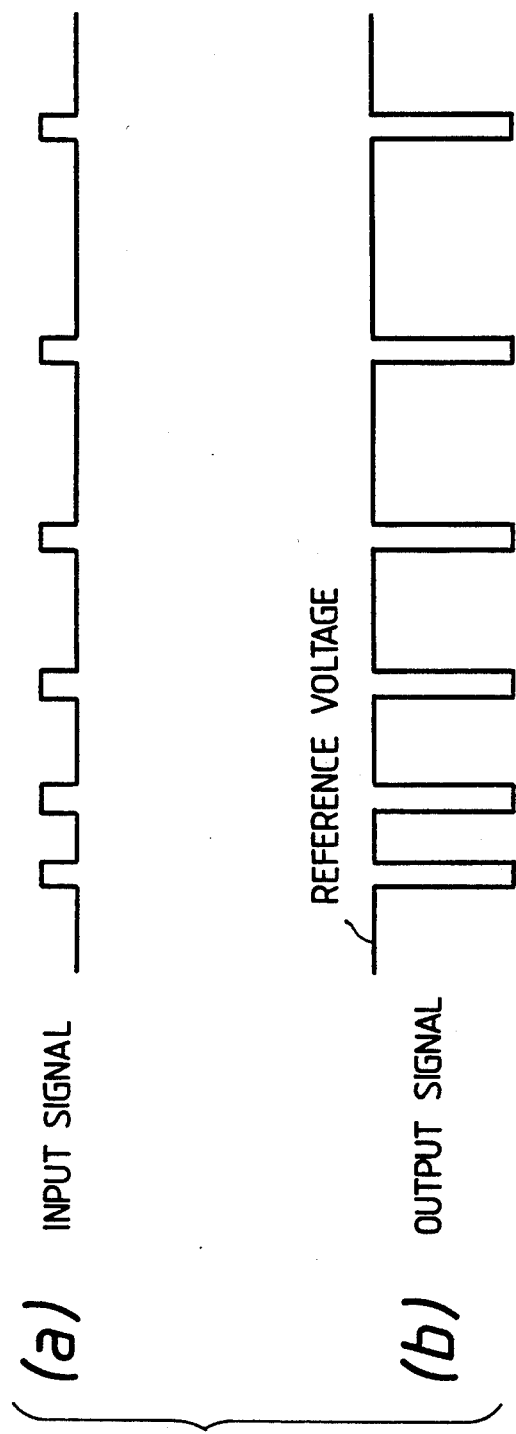
FIGS. 5(a) and 5(b) are signal-waveform diagrams showing pulse signal waveforms amplified by the second embodiment.

Next, a case of the second embodiment, in which a pulse signal with a variable duty cycle is supplied to the signal input terminal 5, is described. Let this case be referred to hereafter as a second operation example of the second embodiment which is explained by referring to FIG. 5, a signal-waveform diagram showing pulse signal waveforms amplified by the second embodiment. FIG. 5(a) shows the waveform of an input signal pulse supplied to the signal input terminal 5 whereas FIG. 5(b) is a diagram showing the waveform of an output signal pulse appearing at the signal output terminal 6.

With no signal input, the second operation example is almost the same as the first operation example. However, the former is different from the latter in that, in the case of the former, the direct-current bias voltage V1 is set at a level equal to the bottom value of the amplitude of the output bias signal.

Next, let a pulse signal shown in FIG. 5(a) be supplied to the signal input terminal 5. The pulse signal goes through the same processing route as the first operation example, appearing at the signal output terminal 6 as an output pulse signal shown in FIG. 5(b). Finally, a limit signal is produced at the output terminal 13 of the comparator 11.

Also in the case of the second operation example, part of the output pulse signal produced by the inverting amplifier 1 is supplied to the peak holder 7' for extracting a peak amplitude value (or a bottom amplitude value) of the output pulse signal. The peak and bottom amplitude values are referred to hereafter simply as a peak value. The peak value is supplied to a non-inverting input terminal of the differential amplifier 9 which also receives the voltage V1 produced by the reference-voltage supply 10 at its inverting input terminal. The same processing as the first operation example is then carried out for adjusting the direct-current operating points of various amplification stages in the inverting amplifier 1 to the voltage V1. As a result, the inverting amplifier 1 produces an output pulse signal which has a synchronization signal with its top level matching the voltage V1 as shown in FIG. 4(b). In addition, the level of the voltage V1 is not effected by variations in amplitude of the pulse signal to be amplified In the second operation example of the embodiment for amplifying a pulse signal as described above, the direct-current negative-feedback effect of the direct-current feedback circuit 3 sustains the direct-current operating points of the inverting amplifier 1 at a fixed value even if the direct-current component of the pulse signal virtually varies with the lapse of time due to its variable duty cycle. In addition, the stabilized direct-current operating points result in an output pulse signal with its bottom level sustained at the value of the voltage V1 and a fixed amplitude even if the duty cycle of the input pulse signal is small or variable.

It is needless to say that the second embodiment can also be expected to give the same effects as those of the first embodiment described earlier.

Figure 6:
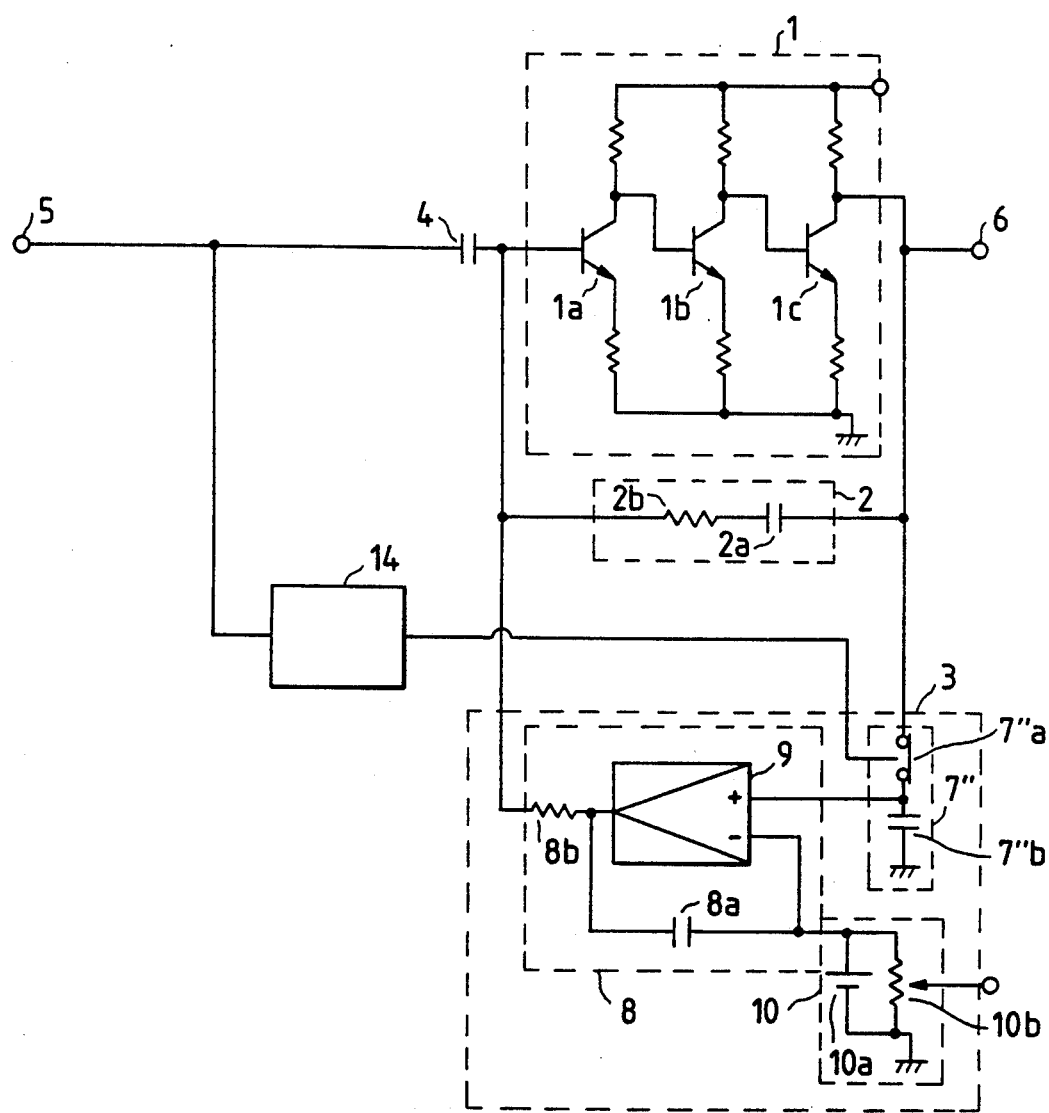
FIG. 6 is a circuit configuration diagram of a third embodiment implementing an amplifying apparatus in accordance with the present invention.
Figure 7:
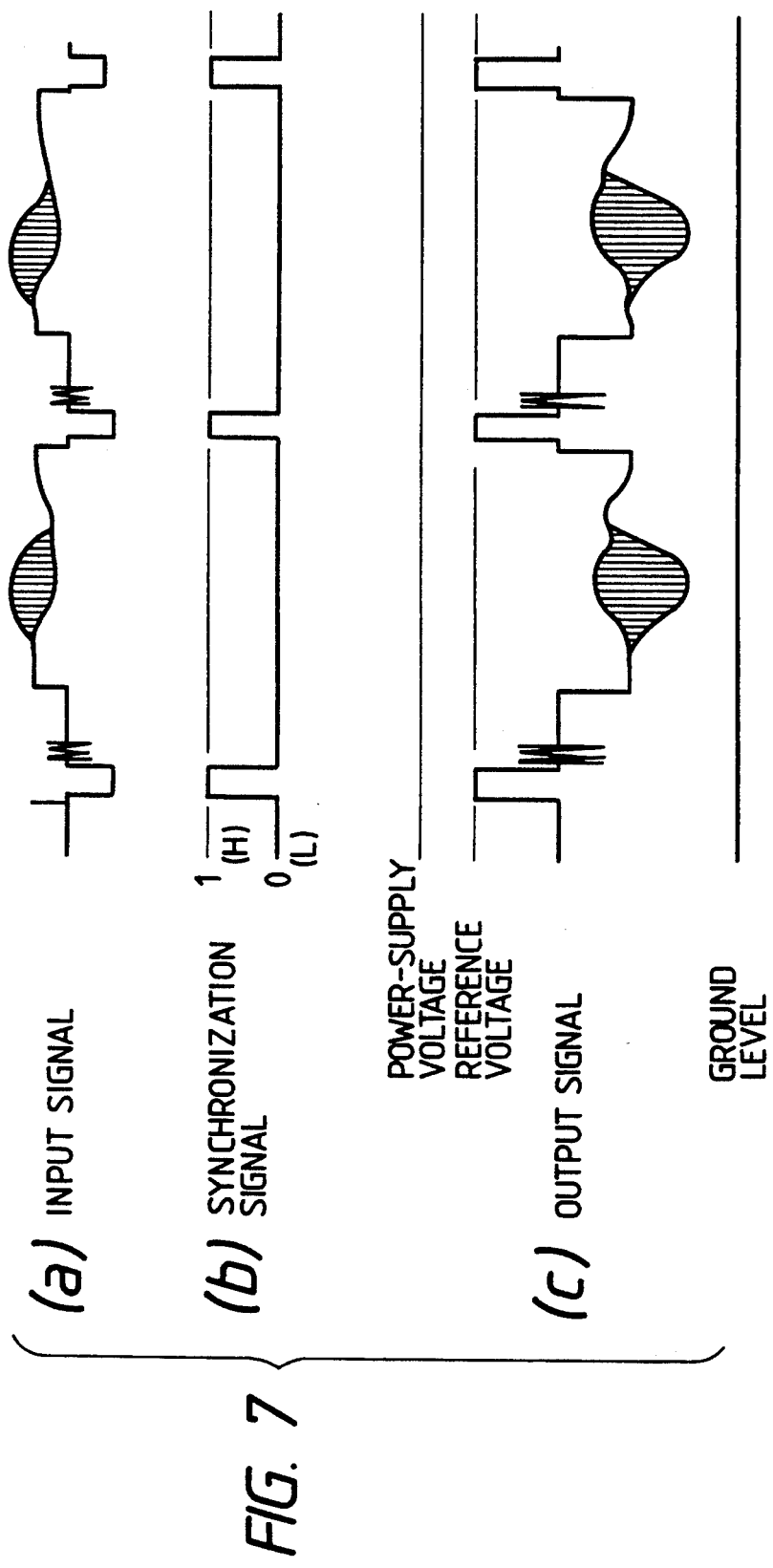
FIGS. 7(a), 7(b) and 7(c) are signal-waveform diagrams showing video signal waveforms amplified by the third embodiment.

Next, a third embodiment provided by the present invention is explained by referring to FIGS. 6 and 7.

As shown in FIG. 6, the third embodiment is different from the first embodiment only in that the operating-point extracting circuit is designed as a sample holder 7" comprising a sampling switch 7"a and a shunt capacitor 7"b and that a synchronization-signal generator is provided for controlling the on/off operation of the sampling switch 7"a. The rest of the configuration is the same as the first embodiment. Components identical with those employed in the first embodiment are assigned the same reference numerals and their description is omitted.

An operation in which a video signal is supplied to the signal input terminal 5 is described by referring to FIG. 7, a signal-waveform diagram showing video signal waveforms amplified by the third embodiment. Such an operation is referred to as a first operation example of the third embodiment. FIG. 7(a) and (c) show waveforms of an input video signal at the signal input terminal 5 and an output video signal at the signal output terminal 6 respectively. FIG. 7(b) shows the waveform of a synchronization signal.

Assume that no signal is supplied to the signal input terminal 5. With no signal input, the direct-current bias voltage V1 is set at a level equal to a peak value (or a bottom value) of the amplitude of the output video signal. In the following description, the term peak value will be used.

Next, an input video signal shown in FIG. 7(a) is supplied to the signal input terminal 5. Much like the first operation example of the second embodiment, an output video signal shown in FIG. 7(c) is produced at the signal output terminal 6. Part of the input video signal is supplied to the synchronization-signal generator 14 to produce the synchronization signal shown in FIG. 7(b) which is fed to the sampling switch 7"a. The sampling switch 7"a is closed by a pulse of the synchronization signal.

Also in the case of the third embodiment, part of the output video signal is supplied to the sample holder 7" for extracting a peak amplitude value, which is referred to hereafter as simply a peak value, of the output video signal in synchronization with the opening/closing operation of the sampling switch 7'a. The peak value is supplied to a non-inverting input terminal of the differential amplifier 9 which also receives the voltage V1 produced by the reference-voltage supply 10 at its inverting input terminal. Much like the first operation example of the second embodiment, the inverting amplifier 1 produces an output video signal which has a synchronization signal with its top level matching the voltage V1 as shown in FIG. 7(c). In addition, the level of the voltage V1 is not effected by variations in amplitude of the video signal.

Much like the first operation example of the second embodiment, the third embodiment also sustains the direct-current operating points of the inverting amplifier 1 at the value of the voltage V1, a highly stabilized value, even if the amplitude of the output video signal considerably varies with the lapse of time. In addition, the output video signal has a synchronization signal with its top level sustained at the value of the voltage V1.

It is needless to say that the third embodiment can also be expected to give the same effects as those of the first embodiment described earlier.

Figure 8:
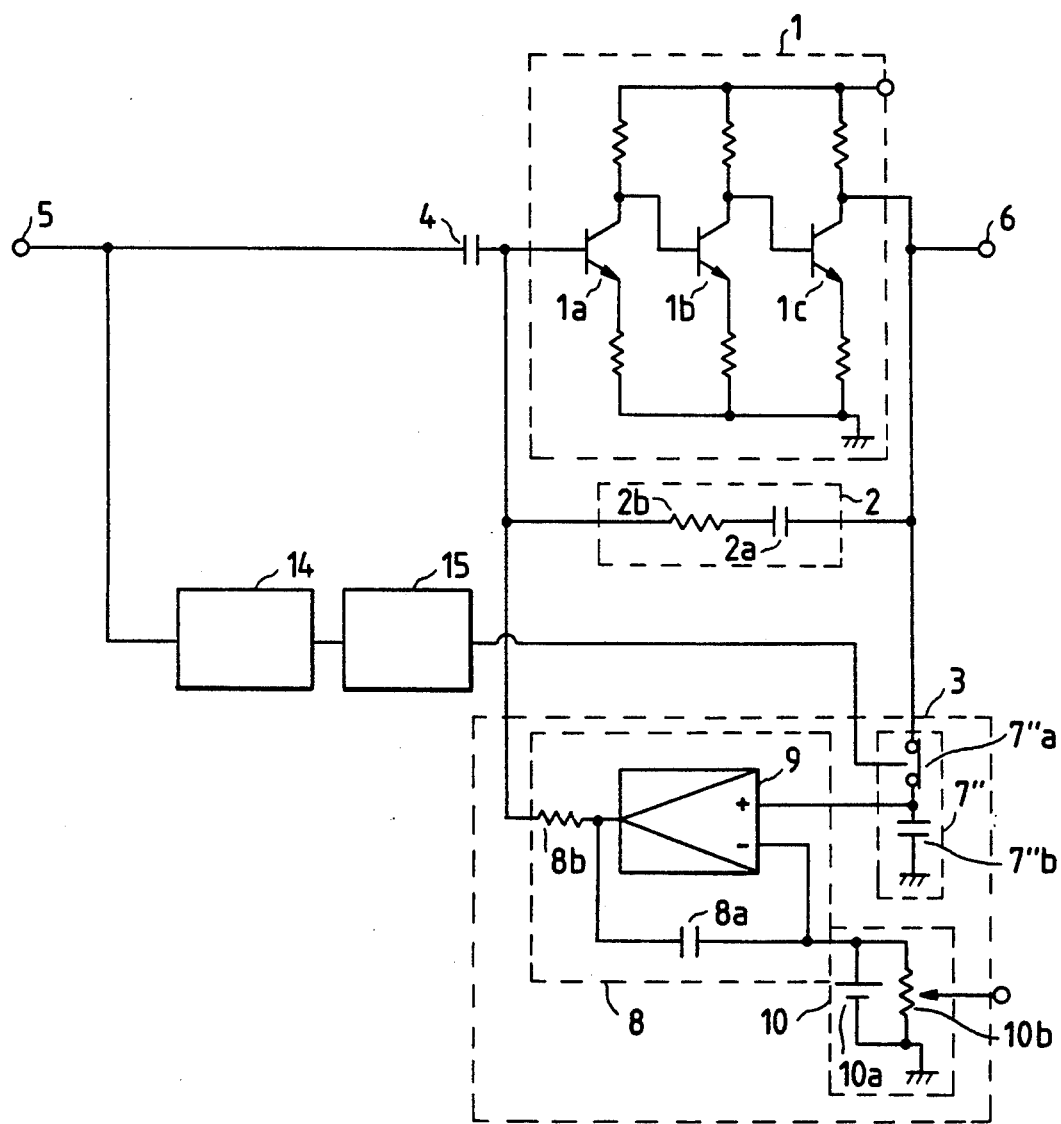
FIG. 8 is a circuit configuration diagram of a fourth embodiment implementing an amplifying apparatus in accordance with the present invention.
Figure 9:
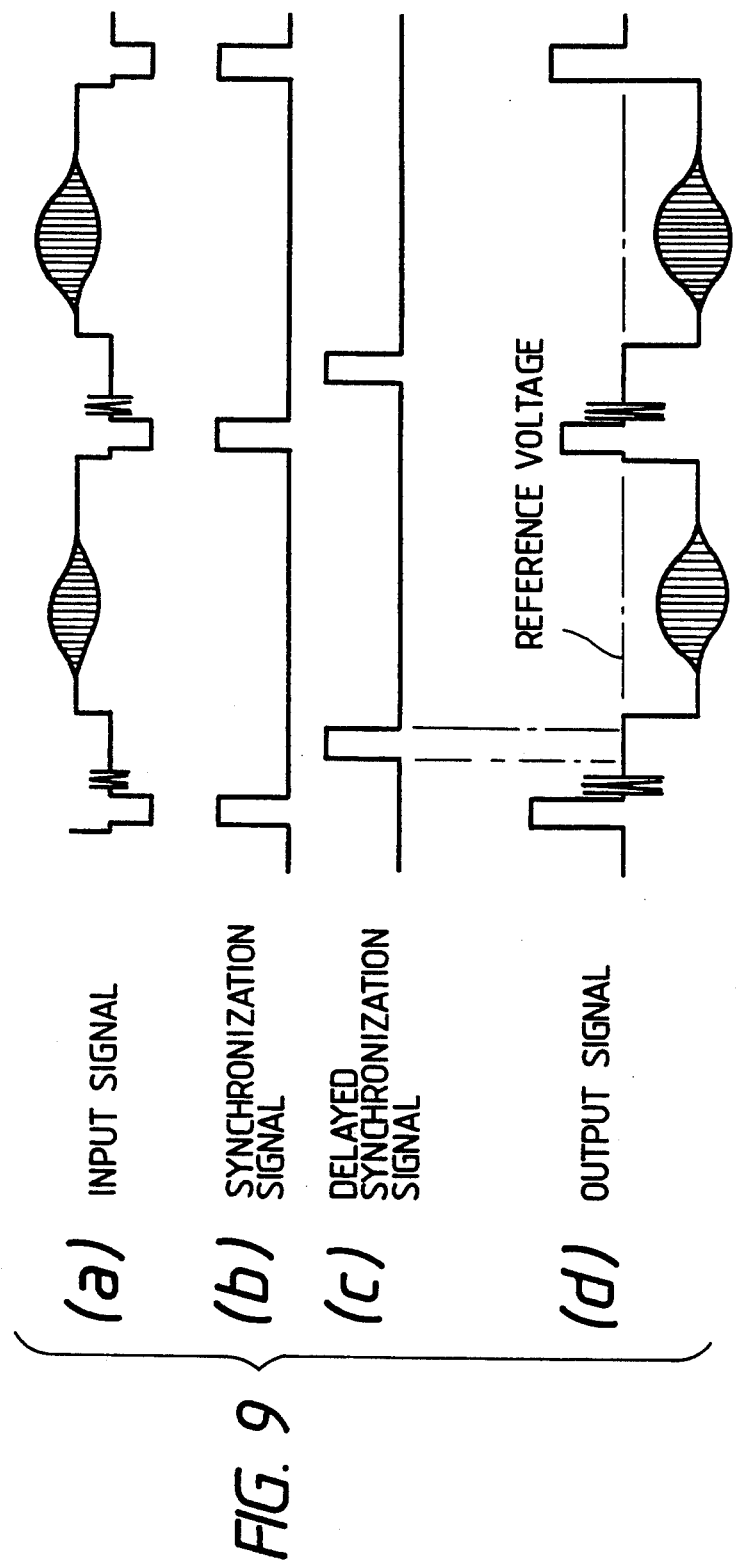
FIGS. 9(a), 9(b), 9(c) and 9(d) are signal-waveform diagrams showing video signal waveforms amplified by the fourth embodiment.

Next, a fourth embodiment provided by the present invention is explained by referring to FIGS. 8 and 9.

As shown in FIG. 8, the fourth embodiment is different from the third embodiment only in that a delay circuit 15 is inserted between the synchronization-signal generator 14 and the sampling switch 7"a for delaying the synchronization signal to a position corresponding to a pedestal-level portion (a black level) of the video signal. The rest of the configuration is the same as the third embodiment.

Components identical with those employed in the third embodiment are assigned the same reference numerals and their description is omitted.

An operation in which a video signal is supplied to the signal input terminal 5 is described by referring to FIG. 9, a signal-waveform diagram showing video signal waveforms amplified by the fourth embodiment. FIG. 7(a) and (d) show waveforms of an input video signal at the signal input terminal 5 and an output video signal at the signal output terminal 6 respectively. FIG. 7(b) and (c) show waveforms of the synchronization signal and the delayed synchronization signal respectively.

The principle of operation of the fourth embodiment is described by first comparing its operation to that of the third embodiment. To begin with, the case of no input signal is considered. In the case of the third embodiment, the value of the direct-current bias voltage V1 supplied to the inverting amplifier 1 from the bias-voltage generator 8 is set to a level equal to the top level of the synchronization signal included in the output video signal. In the fourth embodiment, on the other hand, the value is set at a level equal to the pedestal level (black level) of the output video signal shown in FIG. 9(d) which is different from that of the third embodiment. This difference in set value between the third and fourth embodiments results in the following difference. In the case of the third embodiment, the top level of the synchronization signal included in the output video signal is adjusted using the sample-hold voltage obtained from the synchronization signal to match the value of the direct-current bias voltage V1. In the fourth embodiment, on the other hand, the pedestal level of the output video signal is adjusted using the sample-hold voltage obtained from the delayed synchronization signal to match the direct-current bias voltage V1. Since the overall operation of the fourth embodiment can be well understood from the description of the operation of the third embodiment, its explanation is omitted.

It is needless to say that the fourth embodiment can also be expected to give the same effects as those of the third embodiment described earlier. In addition, the fourth embodiment also results in an effect that the direct-current operating points of the inverting amplifier 1 do not change even if the amplitude of the synchronization signal varies.

Figure 10:
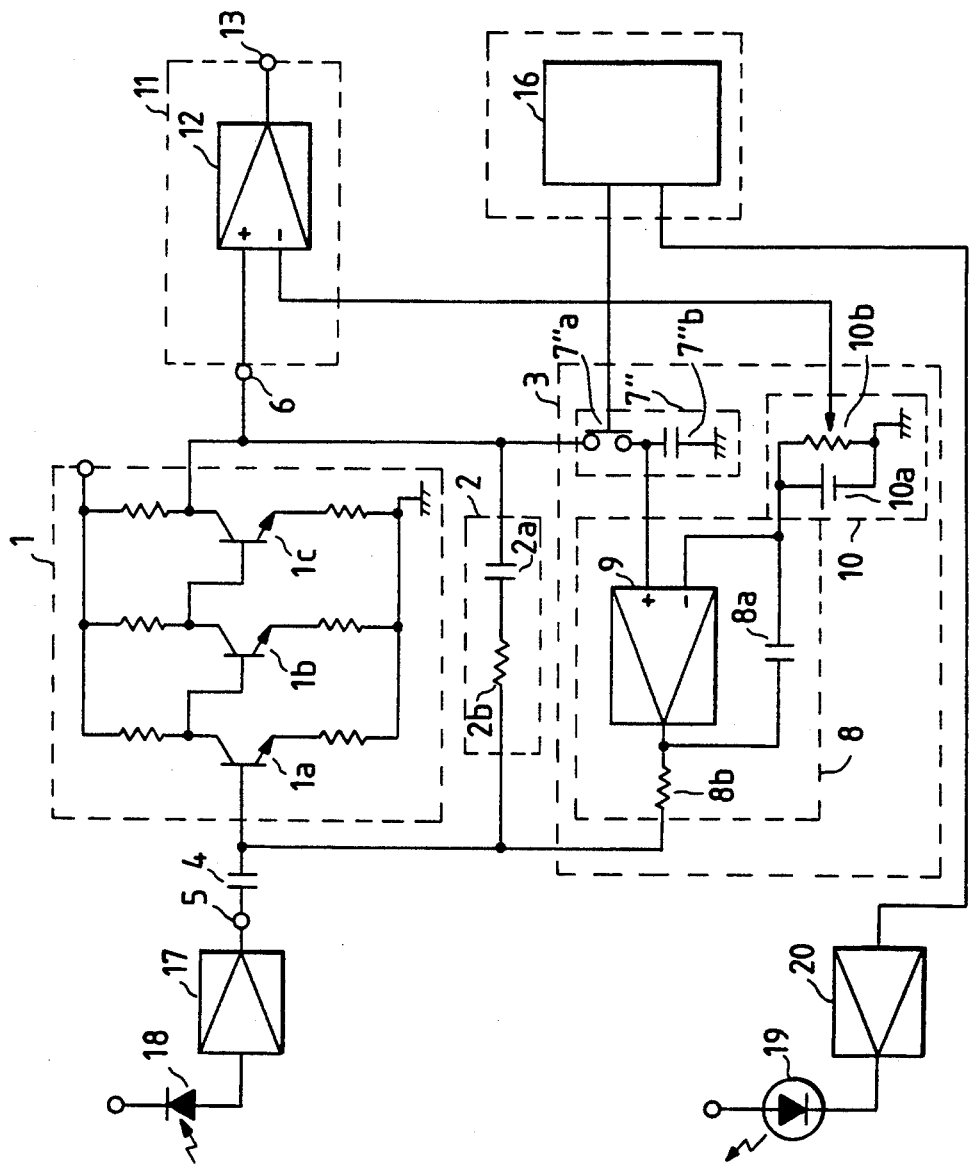
FIG. 10 is a circuit configuration diagram of a fifth embodiment implementing an amplifying apparatus in accordance with the present invention.
Figure 11:
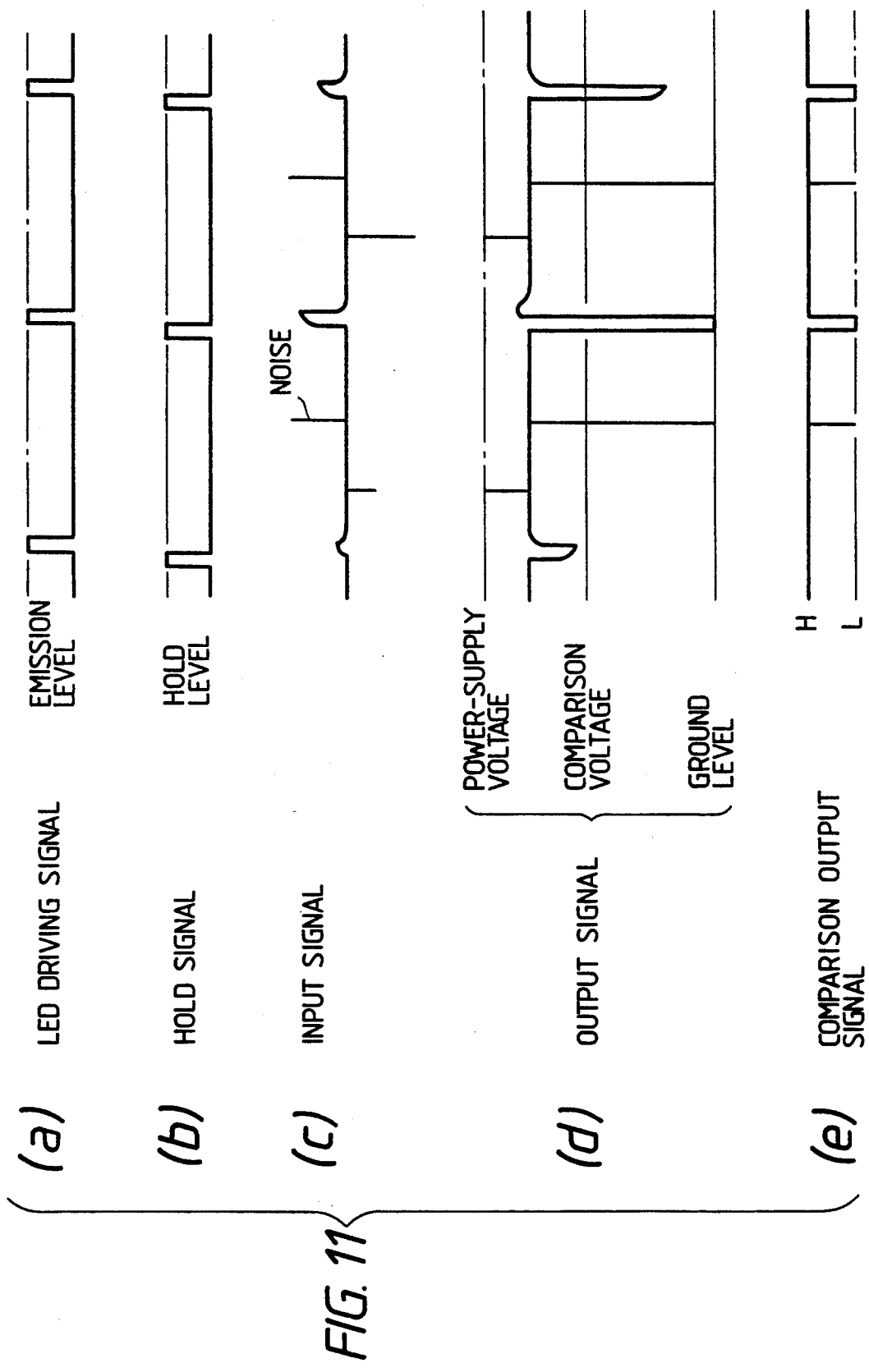
FIGS. 11(a), 11(b), 11(c), 11(d) and 11(e) are signal-waveform diagrams showing pulse signal waveforms amplified by the fifth embodiment.
Figure 12:
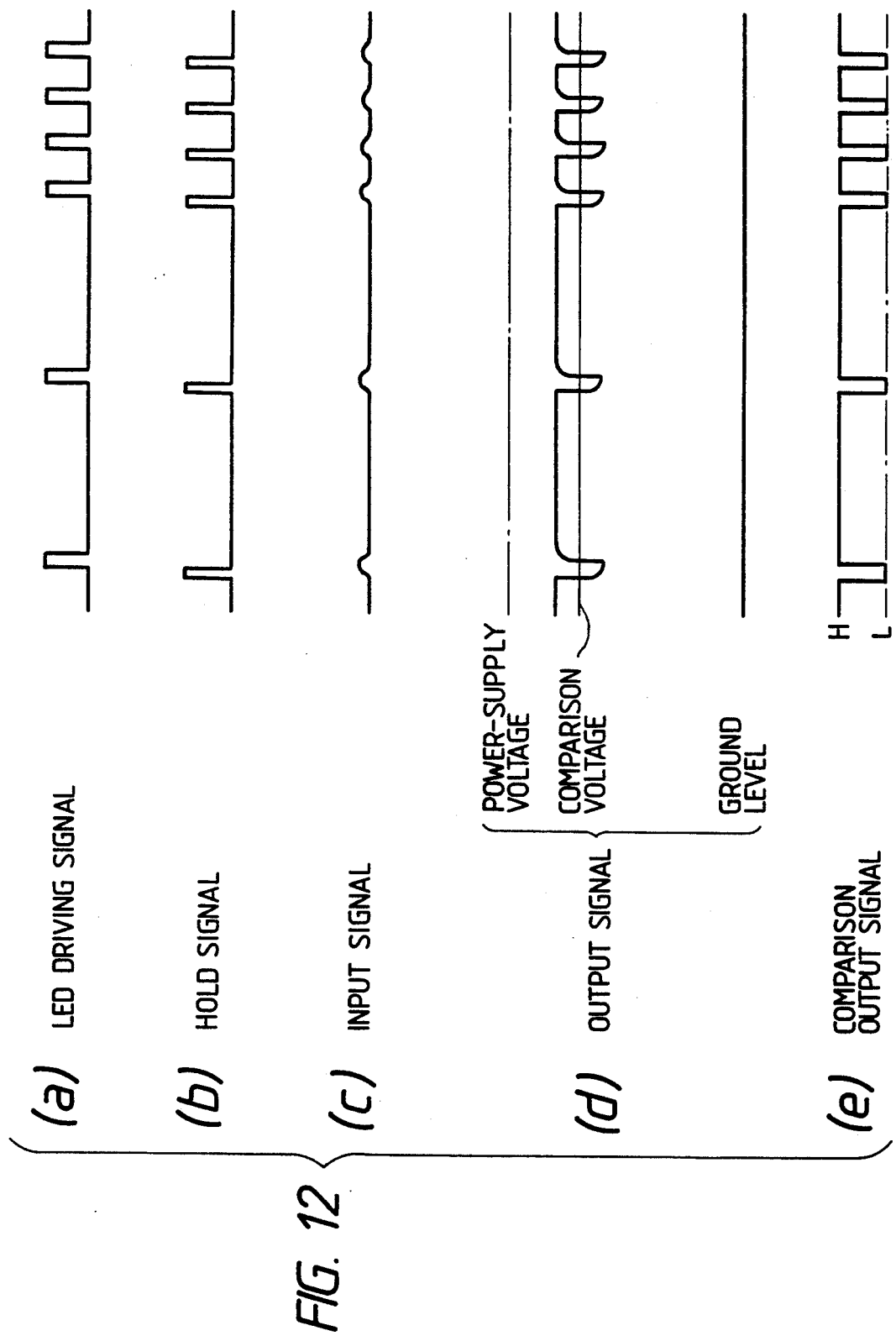
FIGS. 12(a), 12(b), 12(c), 12(d) and 12(e) are signal-waveform diagrams showing other pulse signal waveforms amplified by the fifth embodiment.

Next, a fifth embodiment provided by the present invention is explained by referring to FIGS. 10 to 12.

The fifth embodiment is different from the third one in that, in the case of the latter, the sampling switch 7"a is driven by the synchronization signal from the synchronization-signal generator 14 while, in the case of the former, the sampling switch 7"a is driven by a timing signal (hold signal) from a timing-signal generator 16. Another difference is that the fifth embodiment comprises additional components such as an optical sensor 18, a preamplifier 17, an LED 19 and an LED driver 20. The rest of the configuration is the same as the third embodiment.

An operation of the fifth embodiment, in which a pulse signal having a variety of amplitudes is amplified, is described by referring to a waveform diagram shown in FIG. 11.

First of all, the timing-signal generator 16 outputs an LED driving signal shown in FIG. 11(a) and a hold signal shown in FIG. 11(b) which is produced prior to the generation of the LED driving signal. The LED driving signal is supplied to the LED 19 through the LED driver 20, causing the LED 19 to emit light. The hold signal is, on the other hand, fed to the sampling switch 7"a, closing the sampling switch 7"a. Receiving an optical output from the LED 19, the sensor 18 generates an electrical signal which represents the magnitude of the optical output. After being amplified by the pre-amplifier 17, the signal is supplied to the signal input terminal 5 as an input pulse signal the waveform of which is shown in FIG. 11(c). The input pulse signal comprises a pulse-signal component having a variety of amplitudes and a noise component.

Much like the third embodiment described earlier, with no signal input, the direct-current bias voltage V1 is set at a value equal to the bottom level of an output pulse signal shown in FIG. 11(d).

As mentioned above, the input pulse signal shown in FIG. 11(c) is fed to the signal input terminal 5. As described earlier, the input pulse signal comprises a pulse-signal component and a noise component as shown in the figure. In this case, a direct-current component of the input signal is cut by the input coupling capacitor 4 and, thus, only alternating-current components thereof are supplied to the inverting amplifier 1. The alternating-current components are inverted and amplified thereby to produce an output pulse signal shown in FIG. 11(d) at the signal output terminal 6. As shown in the figure, the output pulse signal also comprises a pulse-signal component and a noise signal. This output pulse signal is supplied to one of the input terminals of the differential amplifier 12 of the comparator 11. A voltage V2 obtained from the reference-voltage supply 10 is fed to the other input terminal of the differential amplifier 12. The differential amplifier 12 compares the amplitude of output pulse signal to the voltage V2. The result of the comparison is a limit signal shown in FIG. 11(e) at the output terminal 13 of the comparator 11.

Also in the case of this embodiment, part of the output pulse signal is supplied to the sample holder 7" of the direct-current feedback circuit 3. The sampling switch 7"a of the sample holder 7" is closed when a hold signal is supplied thereto. Accordingly, when the hold signal is supplied, a bottom level value, which is referred to hereafter simply as a bottom value, of the output pulse signal is extracted. The bottom value is supplied to a non-inverting input terminal of the differential amplifier 9 which also receives the voltage V1 produced by the reference-voltage supply 10 at its inverting input terminal. As a result of a level comparison, the differential amplifier 9 produces a comparison output voltage which is supplied to the inverting amplifier 1 through the feedback resistor 8b for adjusting the direct-current operating points of the inverting amplifier 1 to the value of the voltage V1. In this way, the direct-current operating points of the inverting amplifier 1 are kept at this value. As a result the inverting amplifier 1 produces an output pulse signal at its output terminal with its bottom level matching the voltage V1 as shown in FIG. 11(d). It should be noted that the voltage V1 has a stabilized value, even if the amplitude of the pulse signal varies with the lapse of time.

Subsequently, the output pulse signal is supplied to the comparator 11 along with the voltage V2. At the comparator, the level of the output pulse signal is compared to that of the voltage V2 to cut portions of its signal and noise components below the level of the voltage V2. As a result, a limit signal shown in FIG. 11(e) is obtained at the output terminal 13 of the comparator 11.

In the embodiments described so far, a pulse signal with a variable amplitude is amplified. With this embodiment, instead of amplifying the above first pulse signal, a pulse signal with a variable duty cycle as shown in FIG. 12(c) can also be amplified as well. Also in this case, the same operation as the operation described earlier is performed, and as a result, the direct-current operating points of the inverting amplifier 1 are sustained at the value of the voltage V1, regardless of variations in duty cycle of the pulse signal, to give an output pulse signal shown in FIG. 12(d) at the signal output terminal 6. In addition, a limit signal shown in FIG. 12(e) is obtained at the output terminal 13 of the comparator 11.

As described above, the fifth embodiment stabilizes the direct-current operating points of the inverting amplifier 1 by using the negative-feedback effect of the direct-current feedback circuit 3, allowing the bottom level of the output pulse signal to be sustained at the value of the voltage V1 even if the direct-current component of the supplied input pulse signal substantially changes with the lapse of time due to the fact that the input pulse signal has a variable amplitude or a variable duty cycle.

It is needless to say that the fifth embodiment can also be expected to give the same effects as those of the first embodiment described earlier.

The principle of operation of each embodiment described so far is explained by assuming that a signal behaving appropriately for the embodiment is input. It should be noted, however, applications of the embodiments are not limited to the signals described above. The embodiments are applicable to various kinds of signals.

For example, the video signal shown in FIG. 4 and the pulse signal shown in FIG. 5 can be supplied to the first embodiment or the burst signal shown in FIG. 2 can be fed to the second embodiment.

Next, a sixth embodiment provided by the present invention is explained by referring to FIGS. 16 to 21.

Figure 20:
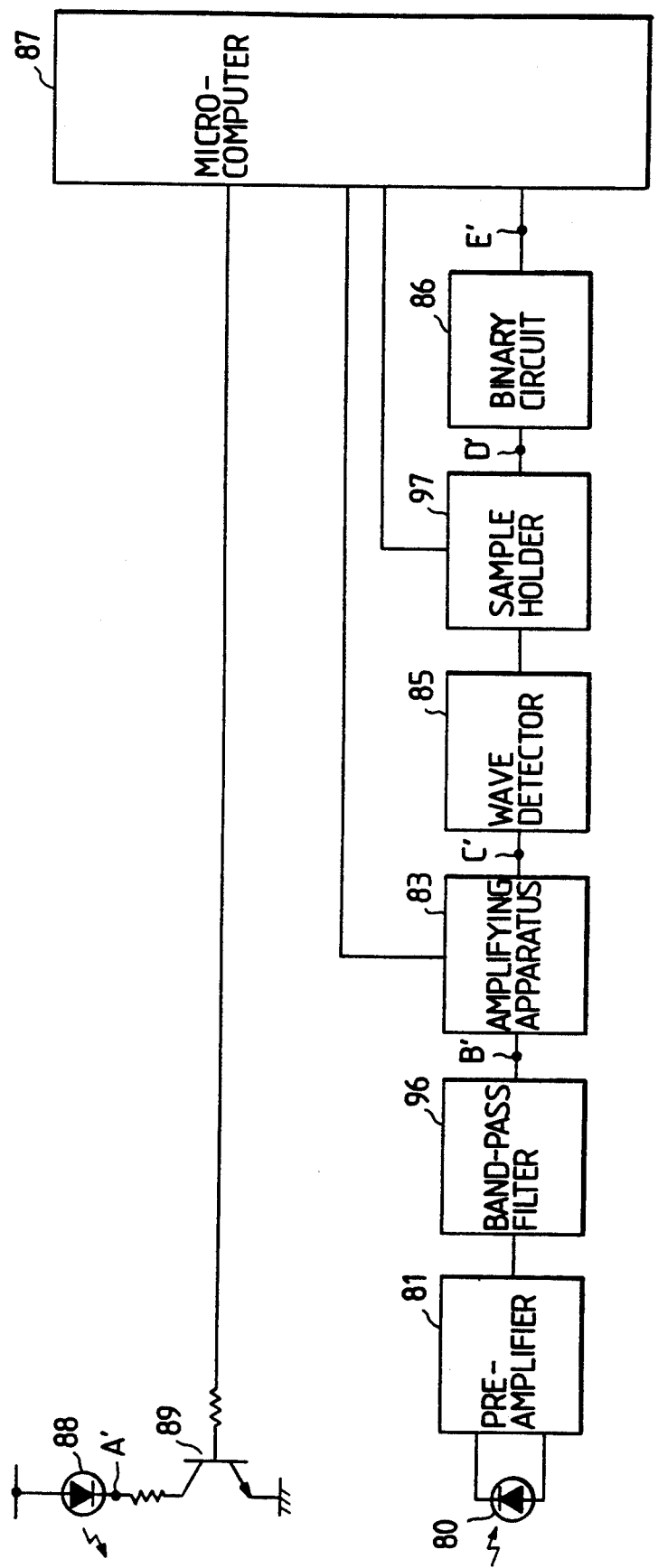
FIG. 20 is a block diagram of a typical object detecting apparatus to which the sixth and seventh embodiments provided by the present invention can be applied.
Figure 21:
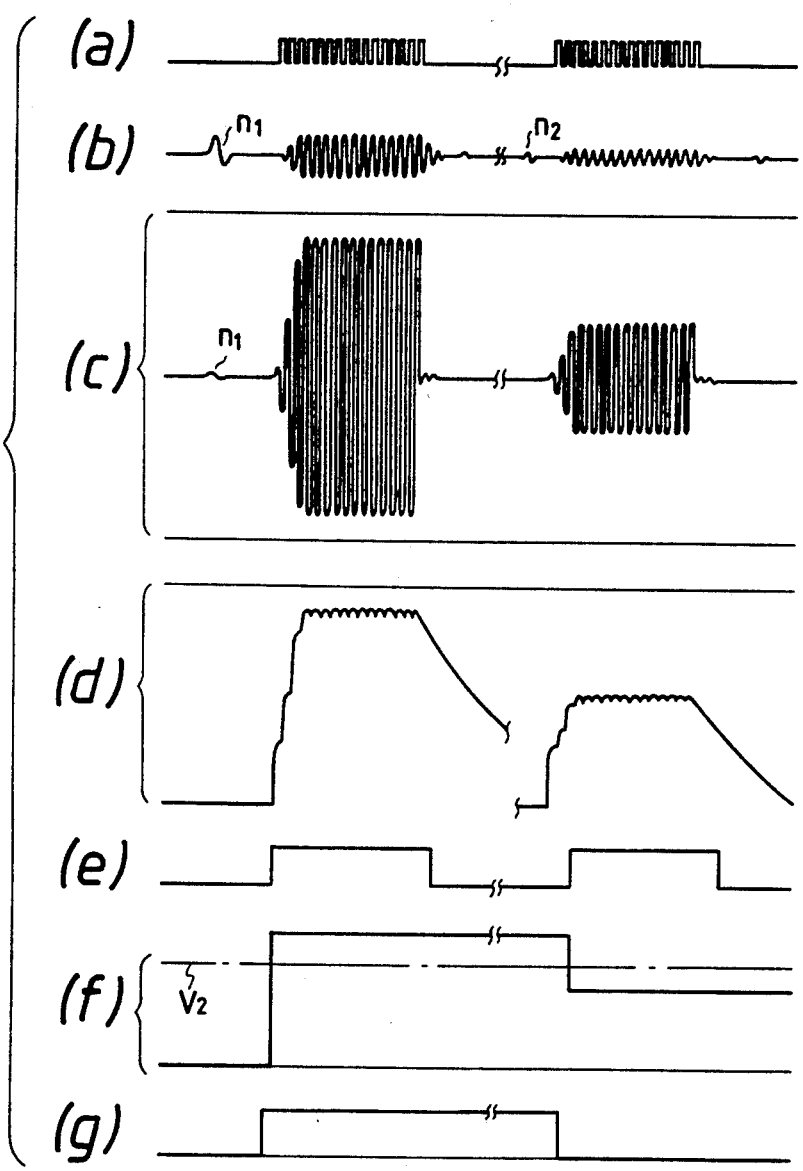
FIGS. 21(a), 21(b), 21(c), 21(d), 21(e), 21(f) and 21(g) are signal-waveform diagrams showing signal states of various portions of the object detecting apparatus shown in FIG. 20.

First of all, the configuration of an object detecting apparatus which is suitable for the sixth embodiment is explained by referring to FIG. 20.

The configuration of an object detecting apparatus shown in FIG. 20 is almost the same as that of the object detecting apparatus shown in FIG. 1 except that the former employs a band-pass filter 96 instead of the low-pass filter 82. In addition, the limiter amplifier 84 is eliminated and a sample holder 97 is incorporated between the wave detector 85 and the binary circuit 86.

The operating states of various components of the object detecting apparatus are described by referring to their waveform diagrams shown in FIGS. 21(a) to (e). FIG. 21(a) shows the waveform of a signal at a point A' shown in FIG. 20, a signal driving the LED 88. FIG. 21(b) shows the waveform of a signal at a point B' shown in FIG. 20, a signal input to the amplifying apparatus 83 provided by the invention. FIG. 21(c) shows the waveform of a signal at a point C' shown in FIG. 20, a signal output by the amplifying apparatus 83. FIG. 21(d) shows the waveform of a signal at a point D' shown in FIG. 20, a hold signal produced at the output by the sample holder 97. FIG. 21(e) shows the waveform of a signal at a point E' shown in FIG. 20, a binary signal output by the binary circuit 86.

The principle of operation of the object detecting apparatus is as follows. The operation comprising the reception of an optical signal (monitor signal) from the LED 88 by the optical sensor 80, the amplification by the preamplifier 81, the elimination of the noise component by the band-pass filter 96 and the feeding of the detection signal shown in FIG. 21(b) to the amplifying apparatus 83 provided by the present invention is the same as that carried out by the object detecting apparatus shown in FIG. 13. Subsequently, the detection signal is amplified by the amplifying apparatus 83 in synchronization with supply timing of the detection signal and converted into the output detection signal shown in FIG. 21(c). Signal components above a predetermined level of the output detection signal are then extracted by the wave detector 85. Subsequently, the extracted signal components are sampled at the supply timings of the detection signal by the sample holder 97 and converted into the hold signal shown in FIG. 21(d). The hold signal is then converted by the binary circuit 86 into the binary signal shown in FIG. 21(e). Finally, the microcomputer 87 processes the binary signal in order to determine whether or not an object is present.

Figure 16:
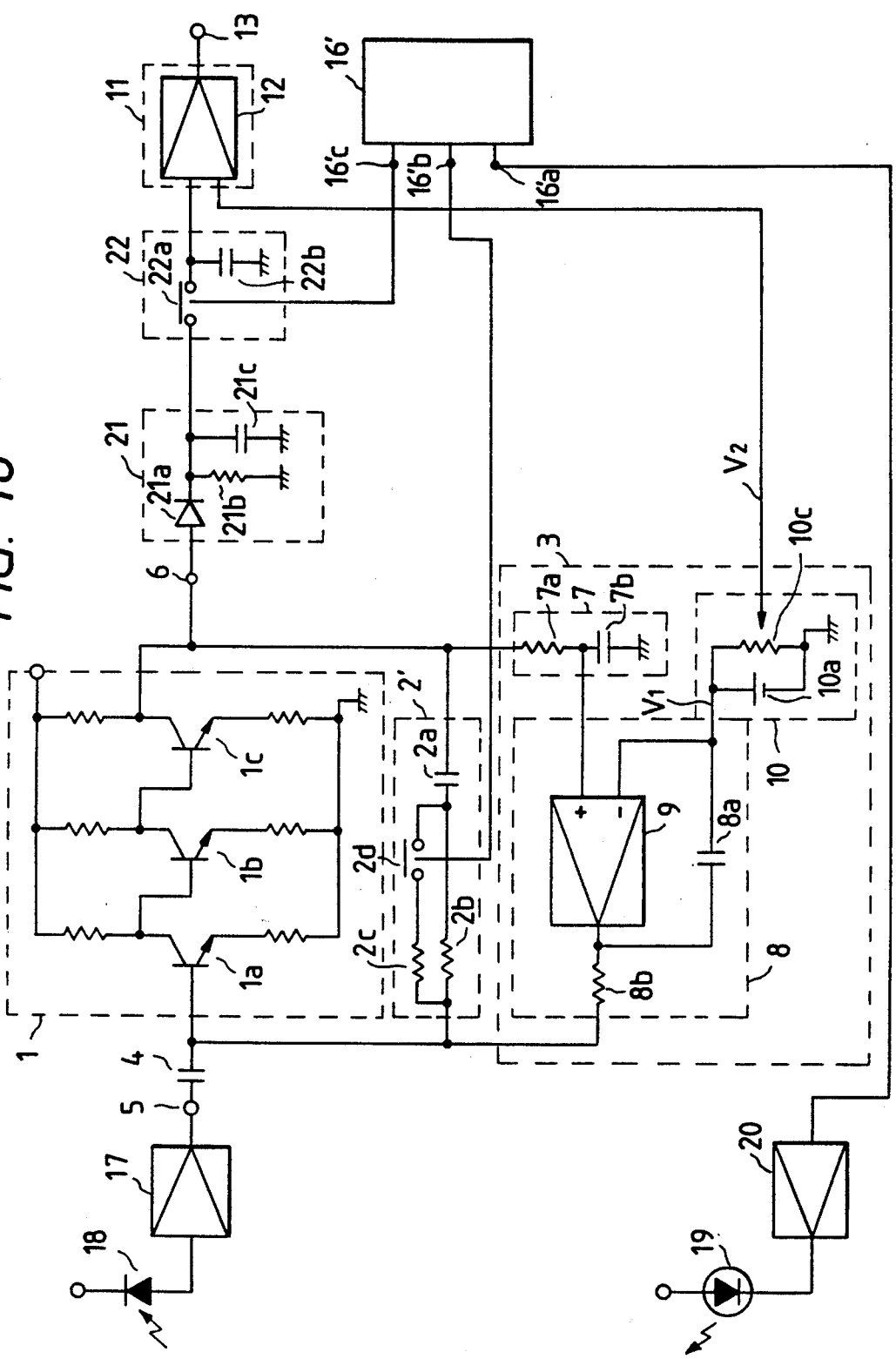
FIG. 16 is a circuit configuration diagram of a sixth embodiment implementing an amplifying apparatus in accordance with the present invention.

Next, the sixth embodiment is described by referring to FIG. 16. As shown in the figure, an alternating-current feedback circuit 2' employed in the sixth embodiment comprises a feedback resistor 2c and a sampling switch 2d in addition to the feedback capacitor 2a and the feedback resistor 2b employed in the first embodiment. The feedback resistor 2b is always tied in the alternating-current feedback circuit 2' while the feedback resistor 2c is connected selectively by the sampling switch 2d.

A wave detector 21 connected to the signal output terminal 6 comprises a series diode 21a, a shunt resistor 21b and a shunt capacitor 21c. A sample holder 22 connected on the output side of the wave detector 21 comprises a series sampling switch 22a and a shunt capacitor 22c. The comparator 11 connected to the output of the sample holder 22 is equipped with the differential amplifier 12. The optical sensor 18 is connected to the signal input terminal 5 through the preamplifier 17. An LED driving output terminal 16'a of a timing generator 16' is connected to the LED 19 through the LED driver 20. The timing generator 16' outputs a periodical LED driving signal and two periodical timing signals to the LED driving output terminal 16'a and timing-signal output terminals 16'b and 16'c. The periodical LED driving signal and timing signals are generated with exactly the same timing. The normally closed sampling switch 2b described earlier is driven to an off state only when the timing signal generated by the timing generator 16' is applied. On the contrary, the normally opened sampling switch 22a is driven to an on state only when the timing signal generated by the timing generator 16' is applied. It should be noted that components identical with those employed in the first embodiment are assigned the same reference numerals and their description is omitted.

In the case of no input signal, the operation of this embodiment is, first of all, the same as that of the first embodiment. That is to say, the direct-current operating points of the transistors 1a to 1c employed by the inverting amplifier 1 at a variety of amplification stages are set at a reference level which matches the value of the voltage V1.

As described earlier, the timing generator 16' produces the LED driving signal periodically. Receiving the LED driving signal, the LED 19 generates a periodical optical signal (monitor signal). The monitor signal is then detected by the optical sensor 18 which, in turn, outputs a detection signal. The detection signal is amplified by the preamplifier 17 and supplied to the signal input terminal 5 as the detection signal shown in FIG. 21(b). The direct-current component of the detection signal is cut by the input coupling capacitor 4 before being fed to the inverting amplifier 1. The inverting amplifier 1 amplifies the detection signal at a high gain, generating an output detection signal at the signal output terminal 6. As shown in FIG. 21(c), the output detection signal has a reference level equal to the voltage V1.

Next, the output detection signal is supplied to the wave detector 21. The wave detector 21 extracts only the positive half-wave component of the output detection signal, converting the output detection signal into a half-wave signal shown in FIG. 21(d). The half-wave signal is supplied to the sample holder 22. The normally opened sampling switch 22a employed in the sample holder 22 is driven to an on state at supply timings of the timing signal (detection signal) shown in FIG. 21(e). Accordingly, the half-wave signal is sampled and held in synchronization with the supplying of the timing signal to produce a hold signal shown in FIG. 21(f). The hold signal is then supplied to the differential amplifier 12 of the comparator 11 along with the voltage V2 obtained from the reference-voltage supply 10, where V1>V2. The differential amplifier 12 compares the amplitude level of the hold signal to that of the voltage V2, outputting only a signal portion of the hold signal exceeding the level of the voltage V2 to the output terminal 13 as a comparison output signal shown in FIG. 21(g).

Part of the output detection signal appearing at the signal output terminal 6 is fed back as a negative quantity to the inverting amplifier 1 through the alternating-current feedback circuit 2'. The normally closed sampling switch 2d of the alternating-current feedback circuit 2' is put in an off state with the supply timing of the timing signal described earlier. With the sampling switch 2d put in an off state, the feedback resistor 2c is cut off from the alternating-current feedback circuit 2'. Accordingly, the negative-feedback amount of the alternating-current feedback circuit 2 decreases synchronously with the supplying of the timing signal (monitor signal). As a result, the alternating-current signal gain of the inverting amplifier 1 increases. With the timing signal set in an inactive state, on the other hand, the normally closed sampling switch 2d is kept in an on state, connecting the feedback resistor 2c to the alternating-circuit feedback circuit 2'. Accordingly, the negative-feedback amount of the alternating-current feedback circuit 2 increases. As a result, the alternating-current signal gain of the inverting amplifier 1 decreases.

In the configuration described above, the amplifying apparatus employing the alternating-current feedback circuit 2' is applied to an object detecting apparatus. In that particular application, the amplifying apparatus is used merely for determining whether or not a detection signal exists. Thus, an amplifying apparatus with a small dynamic range will perform the required function adequately. As a result the power-supply voltage for the amplifying apparatus can be lowered.

Figure 17:
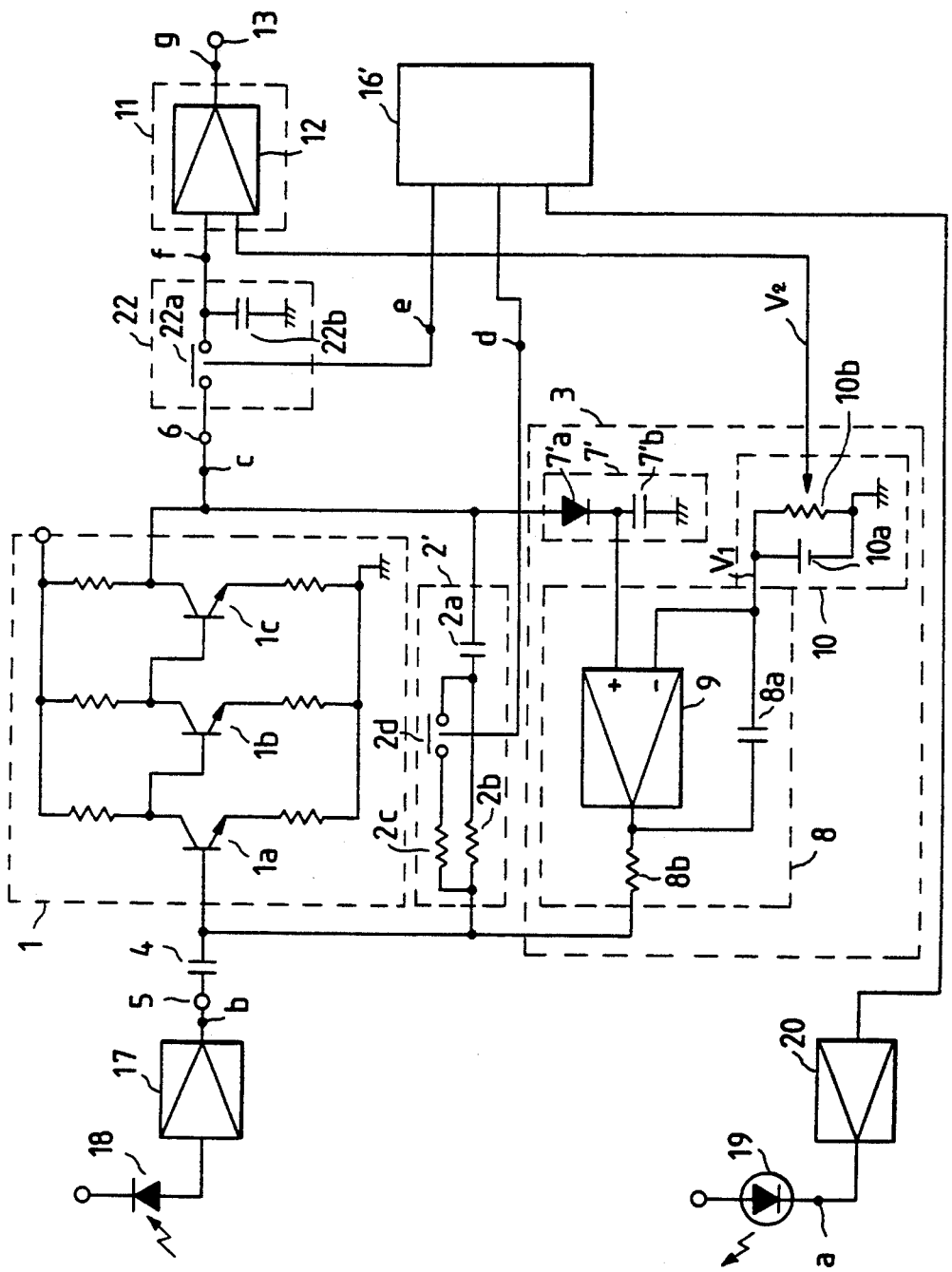
FIG. 17 is a circuit configuration diagram of a seventh embodiment implementing an amplifying apparatus in accordance with the present invention.

Next, a seventh embodiment of the present invention is explained by referring to FIG. 17.

The seventh embodiment has the same configuration as the sixth embodiment except that the operating-point extracting circuit is implemented as a peak holder 7' comprising a series diode. 7'a and a shunt diode 7'b explained in the description of the second embodiment and that the wave detector 31 of the sixth embodiment is eliminated.

Figure 18:
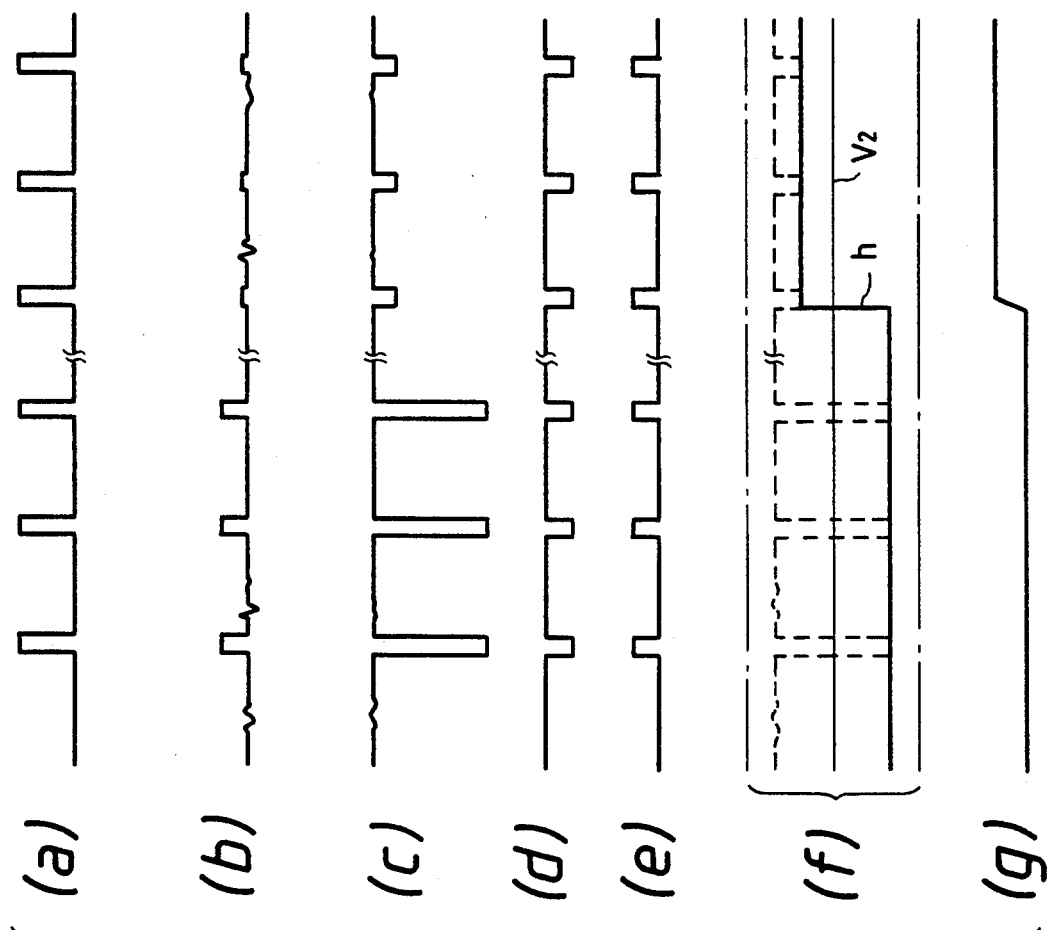
FIGS. 18(a), 18(b), 18(c), 18(d), 18(e), 18(f) and 18(g) are signal-waveform diagrams showing waveforms of signals processed by the seventh embodiment.

The principle of operation of the seventh embodiment is described by referring to FIG. 18. The description is focused on an operation in which a detection signal comprising a series of periodical pulses is supplied to the signal input terminal 5. Such an operation is referred to hereafter as a first operation of the seventh embodiment. FIG. 18(a) shows the waveform of a signal at a point a shown in FIG. 17, a signal driving the LED 19. FIG. 18(b) shows the waveform of a signal at a point b shown in FIG. 17, an input detection signal. FIG. 18(c) shows the waveform of a signal at a point c shown in FIG. 17, an output detection signal. FIG. 18(d) shows the waveform of a signal at a point d shown in FIG. 17, a first timing signal. FIG. 18(e) shows the waveform of a signal at a point e shown in FIG. 17, a second timing signal. FIG. 18(f) shows the waveform of a signal at a point f shown in FIG. 17, a hold signal. FIG. 18(g) shows the waveform of a signal at a point g shown in FIG. 17, a comparison output signal.

In the case of the sixth embodiment, the direct-current bias voltage V1 is set at a value equal to the reference level of the output detection signal with no input signal. In the case of the seventh embodiment, on the other hand, the direct-current bias voltage V1 is set at a value equal to the bottom level of the output detection signal with no input signal.

The operation from the light emission by the LED 19 to the appearance of the output detection signal shown in FIG. 18(c) at the signal output terminal 6 is the same as that of the sixth embodiment. The output detection signal is then supplied to the sample holder 22. In this case, the sampling switch 22a is driven to an on state by the timing signal shown in FIG. 18(e). Accordingly, the output detection signal is sampled and held to produce a hold signal shown in FIG. 18(f). The hold signal is then supplied to the differential amplifier 12 of the comparator 11 along with the voltage V2. The differential amplifier 12 compares the amplitude level of the hold signal to that of the voltage V2, outputting only a signal portion of the hold signal exceeding the level of the voltage V2 to the output terminal 13 as a comparison output signal shown in FIG. 18(g).

Part of the output detection signal appearing at the signal output terminal 6 is fed back as a negative quantity to the inverting amplifier 1 through the alternating-current feedback circuit 2. Much like the sixth embodiment, the feedback has an effect of increasing or decreasing the alternating-current signal gain of the inverting amplifier 1.

In addition, part of the output detection signal appearing at the signal output terminal 6 is supplied to the direct-current feedback circuit 3 for adjusting the direct-current operating points of the inverting amplifier 1 as in the case of the second embodiment.

In this way, the seventh embodiment executes the first operation which is identical with the operation of the sixth embodiment except that the amplified pulse detection signal shown in FIG. 19(a) has a different waveform. The seventh embodiment can thus be expected to give the same effects as the sixth one.

Figure 19:
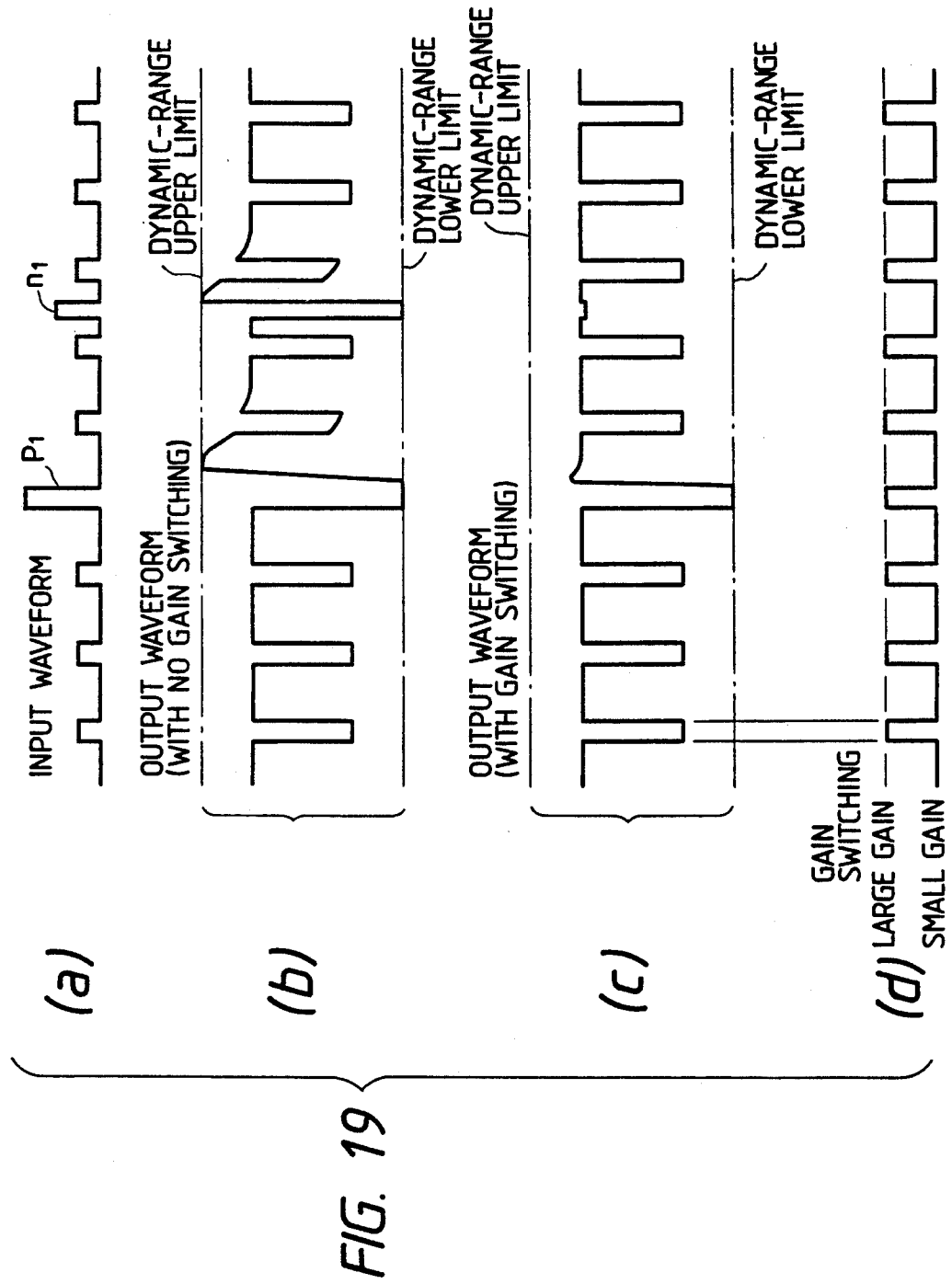

Next, a second operation of the seventh embodiment is described by referring to signal-waveform diagrams shown in FIG. 19. In the second operation, a pulse signal comprising a pulse-signal component P1 having an extremely large amplitude and a noise-signal component nl with a large amplitude is supplied to the signal input terminal 5.

First of all, let a pulse detection signal shown in FIG. 19(a) be supplied to the signal input terminal 5. The conventional amplifying apparatus will get saturated during the periods of a signal pulse P1 and a noise pulse nl both having a large amplitude as shown in FIG. 19(b). The saturation sustains the reference level of the output detection signal in a much changed state for a relatively long period of time. When the pulse detection signal shown in FIG. 19(a) is supplied to the amplifying apparatus provided by the present invention, the amplifying apparatus also gets saturated during the period of the signal pulse P1 as shown in FIG. 19(c) and the saturation sustains the reference level of the output detection signal in a much changed state as in the case of the conventional amplifying apparatus. As the time period of the signal pulse P1 has elapsed, however, the amplification gain of the amplifying apparatus provided by the present invention decreases as shown in FIG. 19(d) due to a large amount of negative feedback. Accordingly, the reference level of the output detection signal varies only slightly and the state in which the reference level is substantially varied is limited to a short period of time. In addition, in the case of the amplifying apparatus provided by the present invention, during the period of the noise pulse nl with a large amplitude, the amplification gain of the amplifying apparatus has already been reduced. Accordingly, not only is the amplifying apparatus not saturated during the period of the noise pulse nl, but the noise pulse nl is reduced to an unnoticable level.

It is seen from the above description that variations in reference level of the output detection signal resulting from the amplification of a detection signal having an irregular amplitude and a variable duty cycle supplied to the seventh embodiment can be reduced considerably to a quantity much smaller than that of the conventional amplifying apparatus.

As described above, the sixth and seventh embodiments each employ an alternating-current feedback circuit 2' comprising two feedback resistors 2b and 2c, one of which can be cut off from the configuration by the sampling switch 2d. However, the alternating-current feedback circuit 2' does not have to be designed into such a configuration. Any feedback circuit can be employed as long as the amount of the negative feedback can be varied by using the first timing signal or a signal of a similar type. The sixth and seventh embodiments offer the following advantages.

First of all, the alternating-current feedback circuit 2' reduces the quantity of the negative feedback only during a supply timing period of the detection signal, causing the inverting amplifier 1 to increase its alternating-current signal gain only during the period. Accordingly, during the periods of noise pulses nl, n2 and so on, which are outside the supply timing period of the detection signal, the amplification factor is smaller than the alternating-current signal gain for the detection signal. Since the amplification factor for the noise pulses nl, n2 and so on is limited, the noise pulses nl, n2 and so on can be reduced to an unnoticable level.

In addition, the inverting amplifier 1 does not clip the waveform of the noise pulses nl, n2 and so on even if their levels are very high due to the fact that the amplification factor for the noise pulses nl, n2 and so on is limited. Accordingly, variations in direct-current operating point of the inverting amplifier 1 due to the clipping of the waveform do not occur.

Moreover, when a detection-signal pulse having a large amplitude is input, the inverting amplifier 1 once gets saturated, but as the time period of the detection-signal pulse has elapsed, the amount of feedback produced by the alternating-current feedback circuit 2' increases, immediately causing the inverting amplifier 1 to experience a large amount of negative feedback. In this way, a feedback signal that eliminates the saturation is thereby supplied to the inverting amplifier 1. Accordingly, the saturation can thus be eliminated in an extremely short period of time, preventing a delayed operation lagging behind the detection signal from occurring.

Furthermore, the alternating-current signal gain of the inverting amplifier 1 varies synchronously with the detection signal. Accordingly, the signal-bandwidth characteristic of the inverting amplifier 1 becomes identical with a filter characteristic having the same discrete spectrum as the detection signal. As a result, the signal bandwidth can be made narrower without blurring the signal waveform particularly during the amplification of the pulse signal to give an amplifying apparatus having an excellent S/N ratio.

Figure 22:
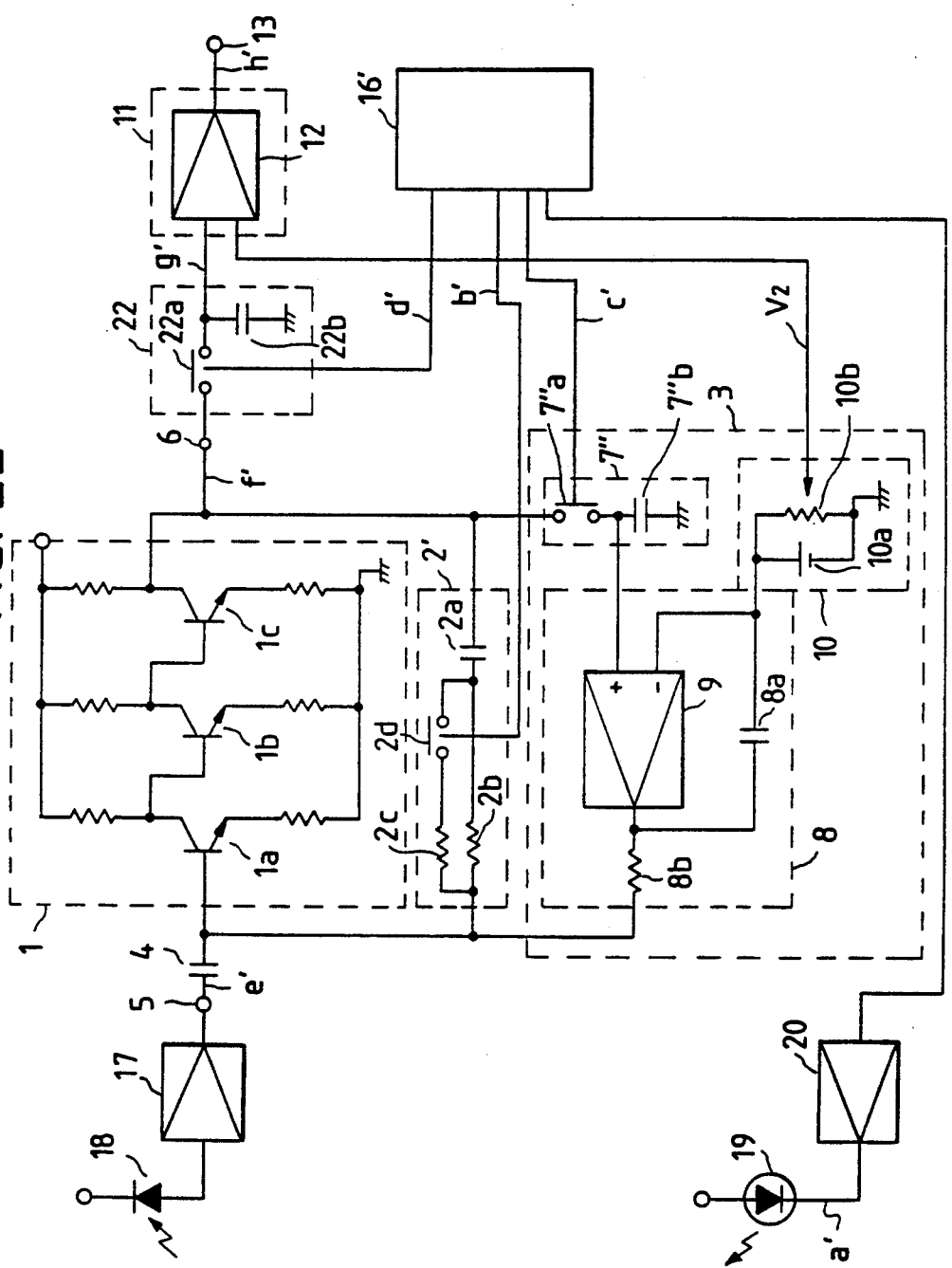
FIG. 22 is a circuit configuration diagram of a eighth embodiment implementing an amplifying apparatus in accordance with the present invention.

Next, an eighth embodiment is explained by referring to FIG. 22. The configuration of the eighth embodiment is the same as that of the seventh embodiment except that the peak holder 7' of the seventh embodiment is replaced by a sample holder 7" comprising the series sampling switch 7"a and the shunt capacitor 7"b explained earlier in the description of the third embodiment.

Figure 23:
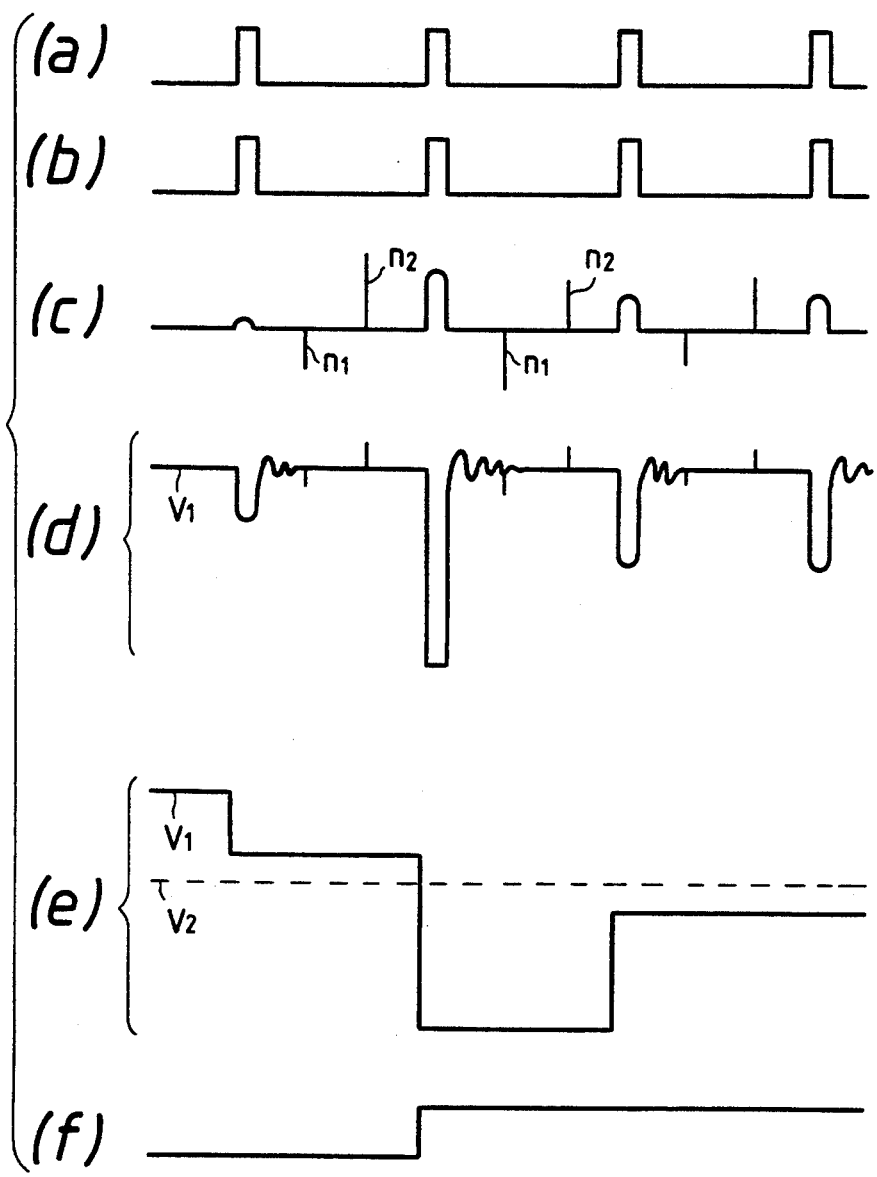
FIGS. 23(a), 23(b), 23(c), 23(d), 23(e) and 23(f) are signal-waveform diagrams showing signal waveforms and supply timings of various portions of the eighth embodiment.
Figure 24:
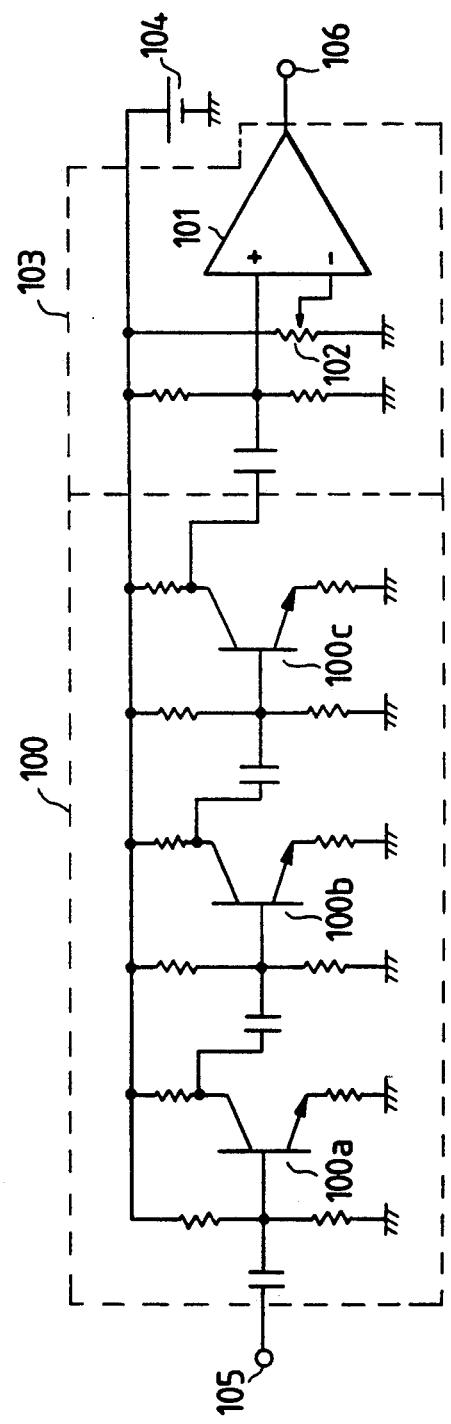
FIG. 24 is a circuit configuration diagram of the conventional amplifying apparatus.

The principle of operation of the eighth embodiment is described by referring to waveforms shown in FIG. 23. FIG. 23(a) shows the waveform of a signal at a point a' shown in FIG. 22, a signal driving the LED 19. FIG. 23(b) shows the waveform of timing signals at point b', c' and d' shown in FIG. 22. FIG. 23(c) shows the waveform of a signal at a point e' shown in FIG. 22, an input detection signal. FIG. 23(d) shows the waveform of a signal at a point f' shown in FIG. 22, an output detection signal. FIG. 23(e) shows the waveform of a signal at a point g' shown in FIG. 22, a hold signal. FIG. 23(f) shows the waveform of a comparison output signal at a point h' shown in FIG. 22.

As shown in FIG. 23(a) and (b), the timing generator 16' outputs timing signals with timing matching the generation period of the driving signal of the LED 19 to three sampling switches 2d, 7"a and 22a.

With no signal input, the direct-current operating points of the transistors 1a, 1b and 1c incorporated in the inverting amplifier 1 are set at a value equal to the voltage V1.

When a detection signal from the optical sensor 18 is received, an output detection signal appears at the signal output terminal 6. The output detection signal is supplied to the sample holder 22 and the alternating-circuit feedback circuit 2' to be processed thereby in the same way as the seventh embodiment described earlier. Next, part of the output detection signal is fed back as a negative quantity to the input terminal of the inverting amplifier 1 through the direct-current feedback circuit 3. In this negative-feedback operation, the output detection signal is first supplied to the sample holder 7". The sampling switch 7"a employed by the sample holder 7" is driven to an on state when the sampling signal is not supplied. Accordingly, the sample holder 7" extracts a component at a reference level with the output detection signal unsupplied, that is, a reference level during periods of time in which the detection signal does not exist. The extracted reference-level component is supplied to the non-inverting input of the differential amplifier 9 while the voltage V1 from the reference-voltage supply 10 is fed to the inverting input thereof. The differential amplifier 9 compares the level of the reference-level component to that of the voltage V1, producing a comparison output voltage which is then fed back to the input terminal of the inverting amplifier 1 through the feedback resistor 8b. The comparison output voltage has such a magnitude and such a polarity that variations in reference level of the output detection signal are compensated to match the voltage V1.

As explained in the description of the seventh embodiment, variations in reference level of the output detection signal due to changes in set value of the direct-current operating point of each amplification stage in the inverting amplifier 1 are detected by the differential amplifier 9 as a comparison output voltage. The comparison output voltage is fed back to the inverting amplifier 1 as a negative quantity. The direct-current operating points of the inverting amplifier 1 are thereby restored to their set value and, at the same time, the reference level of the output detection signal is also restored to the original voltage as well. In this way, the direct-current operating points of the inverting amplifier 1 are always sustained at a fixed value. As a result, the stability of the direct-current operating points is considerably enhanced.

As described above, the alternating-current feedback circuit 2 and the direct-current feedback circuit 3 are connected between the input and output terminals of the inverting amplifier 1. The direct-current feedback circuit 3 comprises an operating-point extracting circuit 7 and a bias-voltage generator 8. The output of the bias-voltage generator 8 is used for setting the direct-current operating points of the inverting amplifier 1. The negative-feedback effect of the direct-current feedback circuit 3 allows the direct-current operating points to be kept at a fixed value regardless of the type and the waveform of a signal to be amplified, and also allows the reference level of the output detection signal to be sustained at a fixed value as well.

In addition, the configuration according to the present invention has an effect of allowing the signal alternating-current gain and the signal-gain frequency characteristic to be set individually.

Moreover, the configuration of the inverting amplifier 1 includes neither internal direct-current bias supply circuit nor differential circuit. In addition, the inverting amplifier 1 also does not have an internal loop feedback circuit in its configuration. It is therefore possible to operate the inverting amplifier 1 at high frequencies and over a wide dynamic range. Accordingly, it is also possible to obtain a high signal alternating-current gain as well.

Another beneficial effect is that a low-frequency differential amplifier can be used for building the bias-voltage generator 8.

In each embodiment described so far, the inverting amplifier 1 comprises three transistor amplification stages. It should be noted, however, that the inverting amplifier 1 does not have to be configured in this way. For example, the inverting amplifier 1 may comprise only a single transistor amplification stage or one to three amplification stages of CMOS inverter gates or bipolar inverter gates.

In addition, in each embodiment described so far, the feedback capacitor 8a is connected between the inverting input and output terminals of the differential amplifier 9 of the bias-voltage generator 8 and the feedback resistor 8b is connected in series to the output terminal of the differential amplifier 1. Much like the inverting amplifier 1, the bias-voltage generator 8 does not have to be configured in this way, as long as the circuit has a direct-current voltage gain larger than its alternating-current voltage gain.

Likewise, the low-pass filter 7, the peak holder 7' and the sample holder 7" are not limited to the circuits employed in the embodiments. Instead, any circuits can be used provided the intended functions can be accomplished.

What is claimed is:

1. An amplifying apparatus comprising:
    a direct-coupled inverting amplifier;
    an alternating-current feedback circuit; and
    a direct-current feedback circuit connected between input and output terminals of said direct-coupled inverting amplifier,
    wherein said direct-current feedback circuit comprises at least an operating-point extracting circuit for extracting a direct-current component and a bias-voltage generator having a direct-current signal gain larger than an alternating-current signal gain thereof and a signal output by said bias-voltage generator is used for setting a direct-current operating bias voltage of said direct-coupled inverting amplifier; and
    wherein said bias-voltage generator comprises a differential amplifier and a capacitive element connected between an inverting input terminal and a non-inverting input terminal of said differential amplifier, and a voltage output by said operating-point extracting circuit is supplied to said non-inverting input terminal while a reference voltage is fed to said inverting input terminal.

2. An amplifying apparatus according to claim 1 characterized in that said operating-point extracting circuit comprises a low-pass filter.

3. An amplifying apparatus according to claim 1 characterized in that said operating-point extracting circuit comprises a peak holder.

4. An amplifying apparatus according to claim 1 characterized in that said operating-point extracting circuit comprises a sample holder.

5. An amplifying apparatus comprising:
a direct-coupled inverting amplifier for receiving a periodical detection signal;
an alternating-current feedback circuit; and
a direct-current feedback circuit connected between input and output terminals of said direct-coupled inverting amplifier,
wherein said alternating-current feedback circuit is designed so as to reduce a signal feedback quantity during a period wherein said detection signal is supplied and to increase said signal feedback quantity during a period wherein said detection signal is not supplied, and said direct-coupled inverting amplifier is designed so that a direct-current operating bias voltage of said direct-coupled inverting amplifier can be set by using a feedback signal output by said direct-current feedback circuit;
wherein said direct-current feedback circuit comprises an operating-point extracting circuit for extracting a direct-current component and a bias-voltage generator and that a direct current operating bias voltage of said direct-coupled inverting amplifier is set by using a signal output by said bias-voltage generator; and
wherein said operating-point extracting circuit employed in said direct-current feedback circuit comprises a differential amplifier having a direct-current signal gain larger than an alternating-current signal gain thereof.

6. An amplifying apparatus according to claim 5 characterized in that said operating-point extracting circuit employed in said direct-current feedback circuit comprises a low-pass filter.

7. An amplifying apparatus according to claim 5 characterized in that said operating-point extracting circuit employed in said direct-current feedback circuit comprises a peak holder.

8. An amplifying apparatus according to claim 5 characterized in that a comparator is connected to an output terminal of said direct-coupled inverting amplifier through a sample holder.

9. An amplifying apparatus comprising a direct-coupled inverting amplifier for receiving a periodical detection signal, an alternating-current feedback circuit having a switch for varying a signal-feedback quantity, a direct-current feedback circuit having a first sample holder and a second sample holder connected to an output terminal of said direct-coupled inverting amplifier, wherein said alternating-current feedback circuit and said direct-current feedback circuit are connected between input and said output terminals of said direct-coupled inverting amplifier, said amplifying apparatus characterized in that switching operations of said switch of said alternating-current feedback circuit and sampling operations of said first and second sample holders are carried out synchronously with said periodical detection signal and a direct-current operating bias voltage of said direct-coupled inverting amplifier is set by using a feedback signal output by said direct-current feedback circuit.

10. An amplifying apparatus according to claim 9 characterized in that said switch of said alternating-current feedback circuit is actuated so as to decrease a signal negative-feedback quantity during a period wherein said detection signal is supplied but to increase said signal negative-feedback quantity during a period wherein said detection signal is not supplied.

11. An amplifying apparatus according to claim 9 characterized in that said first sample holder performs sampling during periods wherein said detection signal is not supplied.

12. An amplifying apparatus according to claim 9 characterized in that said second sample holder performs sampling during periods wherein said detection signal is supplied.

13. An amplifying apparatus according to claim 9 characterized in that a comparator is connected to an output terminal of said second sample holder.

14. An amplifying apparatus according to claim 9 characterized in that said direct-current feedback circuit comprises an operating-point extracting circuit for extracting a direct-current component and a bias-voltage generator and that a direct-current operating bias of said direct-coupled inverting amplifier is set using a signal output by said bias-voltage generator.

15. An amplifying apparatus according to claim 10 characterized in that said bias-voltage generator employed in said direct-current feedback circuit comprises a differential amplifier having a direct-current signal gain larger than an alternating-current signal gain thereof.

16. An amplifying apparatus according to claim 9 characterized in that said direct-coupled inverting amplifier has a configuration not including an individual direct-current bias supplying means at each amplifying stage and a differential circuit portion.

* * * * *